(12) United States Patent
Yamamoto

(10) Patent No.: US 10,394,273 B2
(45) Date of Patent: Aug. 27, 2019

(54) CIRCUIT DEVICE, OSCILLATOR, ELECTRONIC APPARATUS, AND VEHICLE

(71) Applicant: Seiko Epson Corporation, Tokyo (JP)

(72) Inventor: Takehiro Yamamoto, Matsumoto (JP)

(73) Assignee: Seiko Epson Corporation (JP)

( * ) Notice: Subject to any disclaimer, the term of this patent is extended or adjusted under 35 U.S.C. 154(b) by 58 days.

(21) Appl. No.: 15/725,713

(22) Filed: Oct. 5, 2017

(65) Prior Publication Data
US 2018/0107238 A1 Apr. 19, 2018

(30) Foreign Application Priority Data
Oct. 13, 2016 (JP) ................................. 2016-201488

(51) Int. Cl.
| | |
|---|---|
| *H03B 5/06* | (2006.01) |
| *H03B 5/36* | (2006.01) |
| *H03L 1/02* | (2006.01) |
| *G06F 1/04* | (2006.01) |
| *H03K 5/19* | (2006.01) |
| *H03K 3/03* | (2006.01) |

(52) U.S. Cl.
CPC ................. *G06F 1/04* (2013.01); *H03B 5/36* (2013.01); *H03B 5/362* (2013.01); *H03B 5/368* (2013.01); *H03K 5/19* (2013.01); *H03L 1/028* (2013.01); *H03B 5/06* (2013.01); *H03K 3/0307* (2013.01)

(58) Field of Classification Search
CPC .... G06F 1/04; H03B 5/06; H03B 5/30; H03B 5/32; H03B 5/36; H03B 5/362; H03B 5/364; H03B 5/366; H03B 5/368; H03L 1/02; H03L 1/028
See application file for complete search history.

(56) References Cited

U.S. PATENT DOCUMENTS

| | | | | |
|---|---|---|---|---|
| 3,978,650 | A | * 9/1976 | Hashimoto | G04F 5/06 368/200 |
| 4,537,515 | A | * 8/1985 | Dinger | G04F 5/06 331/176 |
| 7,055,045 | B1 | * 5/2006 | Gaboriau | G06F 1/04 327/565 |
| 7,777,584 | B2 | 8/2010 | Inoue | |
| 10,135,390 | B2 | * 11/2018 | Kumar | H03B 5/06 |
| 2013/0076426 | A1 | * 3/2013 | Chen | G06F 1/04 327/291 |

FOREIGN PATENT DOCUMENTS

| | | |
|---|---|---|
| JP | 08-037451 A | 2/1996 |
| JP | 10-004347 A | 1/1998 |
| JP | 2008-193499 A | 8/2008 |
| JP | 2009-151600 A | 7/2009 |

* cited by examiner

*Primary Examiner* — Levi Gannon
(74) *Attorney, Agent, or Firm* — Harness, Dickey & Pierce, P.L.C.

(57) ABSTRACT

A circuit device includes an oscillation circuit, a clock signal output circuit that outputs a clock signal based on an output signal from the oscillation circuit, and an output control circuit. The output control circuit includes a counter circuit that performs a counting process on the basis of the output signal from the oscillation circuit, and a count enable signal generation circuit that outputs a count enable signal for the counter circuit. The counter circuit starts the counting process when the count enable signal becomes active, and outputs an output enable signal for the clock signal to the clock signal output circuit on the basis of a result of the counting process.

20 Claims, 16 Drawing Sheets

CIRCUIT DEVICE, OSCILLATOR, ELECTRONIC APPARATUS, AND VEHICLE

BACKGROUND

1. Technical Field

The present invention relates to a circuit device, an oscillator, an electronic apparatus, and a vehicle.

2. Related Art

In the related art, there is an oscillator such as a temperature compensated crystal oscillator (TCXO), an oven controlled crystal oscillator (OCXO), or a simple packaged crystal oscillator (SPXO). For example, the TCXO is an oscillator which can obtain a stable oscillation frequency with respect to a change in an environmental temperature by compensating for temperature characteristics of an oscillation frequency of a quartz crystal resonator.

In this oscillator, there is a case where various pieces of control are performed during activation so that an oscillation signal gradually increases and then proceeds to a stable oscillation state during the activation (starting of oscillation). Regarding such a technique, there are techniques disclosed in, for example, JP-A-2008-193499 and JP-A-2009-151600. In JP-A-2008-193499, an oscillation circuit includes an integration circuit which integrations an oscillation signal and a discharge circuit which releases electric charge integrated into the integration circuit, and outputs a clock signal based on the oscillation signal in a case where an integration voltage of the integration circuit reaches a predetermined voltage. In JP-A-2009-151600, the number of pulses of an oscillation signal is counted with a counter, activation of an oscillation circuit is accelerated by increasing a bias current of the oscillation circuit until a count value reaches a predetermined number, and the bias current of the oscillation circuit is reduced in a case where the count value reaches the predetermined number.

In such an oscillator, in a case where there is an environmental change or a process change, there is a problem in that there is concern that an appropriate clock signal (having, for example, an appropriate duty) may not be output during activation.

As the related art, for example, as disclosed in JP-A-2008-193499, there is a technique of controlling output of a clock signal by integrating an output signal from an oscillation circuit. However, since the output of a clock signal is controlled through analog processing, it is difficult to cope with a wide change range of an environmental temperature, a process variation, or the like, and also to output an appropriate clock signal satisfying a specification during activation. For example, if an oscillation signal increases to some extent, an integration voltage reaches a predetermined voltage, and thus a clock signal is output. However, if the oscillation signal does not sufficiently increase at that time, a clock signal having an appropriate duty may not be obtained. The duty during activation changes due to a wide change range of an environmental temperature, a process variation, or the like, and thus may not satisfy a specification. For example, in an on-vehicle application or the like, a change in an environmental temperature is considerable, and thus it is necessary to cope with a wide temperature range.

As disclosed in JP-A-2009-151600, there is the related art using a counter for control during activation of an oscillation circuit. However, in JP-A-2009-151600, the counter is used for control for making activation of the oscillation circuit earlier.

SUMMARY

An advantage of some aspects of the invention is to provide a circuit device, an oscillator, an electronic apparatus, and a vehicle, capable of outputting an appropriate clock signal during activation of an oscillation circuit even in a case where there is an environmental change, a process change, or the like.

The advantage can be achieved by the following configurations.

An aspect of the invention relates to a circuit device including an oscillation circuit that causes an resonator to oscillate; a clock signal output circuit that outputs a clock signal based on an output signal from the oscillation circuit; and an output control circuit that controls output from the clock signal output circuit, in which the output control circuit includes a counter circuit that performs a counting process on the basis of the output signal from the oscillation circuit, and a count enable signal generation circuit that outputs a count enable signal for the counter circuit, and in which the counter circuit starts the counting process when the count enable signal becomes active, and outputs an output enable signal for the clock signal to the clock signal output circuit on the basis of a result of the counting process.

According to the aspect of the invention, the counter circuit starts the counting process when the count enable signal generation circuit causes the count enable signal to be active, and outputs the output enable signal for the clock signal to the clock signal output circuit on the basis of a result of the counting process. As mentioned above, the count enable signal generation circuit and the counter circuit perform output control for a clock signal, and thus it is possible to secure time until an appropriate oscillation state occurs during activation of the oscillation circuit. Consequently, it is possible to output an appropriate clock signal during activation of the oscillation circuit even in a case where there is an environmental change, a process change, or the like.

In the aspect of the invention, the count enable signal generation circuit may generate the count enable signal on the basis of an output signal from the oscillation circuit.

As mentioned above, the count enable signal is generated on the basis of an output signal from the oscillation circuit, and thus it is possible to start a counting process on the basis of the output signal from the oscillation circuit. In other words, it is possible to start the counting process in a case where the output signal (an oscillation state of the oscillation circuit) from the oscillation circuit satisfies a predetermined condition. Consequently, after the amplitude or the duty of the output signal from the oscillation circuit is brought into a state in which a counting process can be appropriately performed, the counting process can be started, and thus it is possible to appropriately perform the counting process.

In the aspect of the invention, the count enable signal generation circuit may include a smoothing circuit that smooths an output signal from the oscillation circuit.

According to the aspect of the invention with this configuration, an output signal from the oscillation circuit can be smoothed so as to be converted into a DC signal. It is possible to monitor an oscillation state (the growth extent of oscillation during activation) of the oscillation circuit by using the smoothed signal.

In the aspect of the invention, the count enable signal generation circuit may further include a detection circuit that detects a voltage level of an output signal from the smoothing circuit, and outputs the count enable signal.

A voltage level of an output signal from the smoothing circuit changes depending on the amplitude of an output signal from the oscillation circuit. Thus, it is possible to detect that the output signal from the oscillation circuit reaches amplitude in which a counting process can be started by detecting a voltage level of an output signal from the smoothing circuit. It is possible to cause the count enable signal to be active on the basis of a detection result thereof.

In the aspect of the invention, the detection circuit may cause the count enable signal to be active when a voltage level of an output signal from the smoothing circuit exceeds a predetermined voltage level.

As oscillation in the oscillation circuit grows, and thus the amplitude of the output signal increases, a voltage level of the output signal from the smoothing circuit is heightened. Thus, by detecting that a voltage level of the output signal from the smoothing circuit exceeds a predetermined voltage level, the count enable signal can be caused to be active in a case where oscillation has grown to desired oscillation amplitude.

In the aspect of the invention, the detection circuit may include a logic inversion circuit to which an output signal from the smoothing circuit is input, and a Schmitt trigger circuit that receives an output signal from the logic inversion circuit and outputs the count enable signal.

According to the aspect of the invention with this configuration, when a voltage level of the output signal from the smoothing circuit exceeds a logical threshold value of the logic inversion circuit, a logic level of the output signal from the logic inversion circuit changes. In other words, since the output signal from the smoothing circuit is input to the logic inversion circuit, it can be determined whether or not a voltage level of the output signal from the smoothing circuit exceeds a predetermined voltage level (logical threshold value).

In the aspect of the invention, the detection circuit may cause the count enable signal to be inactive when the output enable signal becomes active.

According to the aspect of the invention with this configuration, an operation of the counter circuit can be disabled in a case where the output enable signal changes from an inactive state to an active state. As mentioned above, it is possible to reduce power consumption of the circuit device by disabling an operation of the counter circuit when a clock signal starts to be output.

In the aspect of the invention, the counter circuit may start the counting process when the count enable signal becomes active, and may cause the output enable signal to be active when a count value in the counting process reaches a predetermined set value.

According to the aspect of the invention with this configuration, a period until outputting of the clock signal is started after the count enable signal becomes active is controlled according to counting of the number of pulses of an output signal from the oscillation circuit. An oscillation frequency of the resonator is specific to the resonator, and thus the period is scarcely influenced by an environmental temperature, a process change, or the like. Consequently, an appropriate period without depending on an environmental temperature, a process change, or the like is realized.

In the aspect of the invention, the predetermined set value may be variable.

Time until an appropriate clock signal is obtained from activation of the oscillation circuit may change due to an environmental factor, a process change, or the like. In relation to this fact, according to the aspect of the invention, appropriate predetermined set values may be set according to various environmental factors, process changes, or the like.

In the aspect of the invention, the circuit device may further include a temperature compensation unit that performs temperature compensation on an oscillation frequency in the oscillation circuit on the basis of a temperature detection signal from a temperature sensor, and the predetermined set value may be set to be variable on the basis of the temperature detection signal.

If an environmental temperature changes, the time required for an appropriate clock signal to be obtained from activation of the oscillation circuit changes. In relation to this fact, according to the aspect of the invention, an appropriate predetermined set value may be set on the basis of the temperature detection signal from the temperature sensor.

In the aspect of the invention, the counter circuit may include a counter that performs a counting operation on the basis of an output signal from the oscillation circuit, and an output circuit that causes the output enable signal to be inactive when a reset signal is active, and causes the output enable signal to be active when an output signal from the counter becomes active after the reset signal becomes inactive.

According to the aspect of the invention with this configuration, if the reset signal becomes inactive, the oscillation circuit is activated, then, the count enable signal becomes active, an output signal from the counter becomes active, and thus the output enable signal is caused to be active by the output circuit. Consequently, the count enable signal generation circuit can be operated in a case where the oscillation circuit is activated, and thus the output enable signal can be caused to be active after the time required to obtain a clock signal having an appropriate duty elapses.

In the aspect of the invention, the output circuit may be an RS latch.

An operation of the output circuit is performed by using the RS latch as mentioned above. In other words, in a case where the output signal from the counter becomes active after the reset signal becomes inactive, the output enable signal can be caused to be active.

In the aspect of the invention, the clock signal output circuit may further include a selection circuit that selects either one of an output signal from the oscillation circuit and a frequency division signal obtained by dividing a frequency of the output signal from the oscillation circuit, and a switch circuit. When the output enable signal is inactive, the selection circuit may be in a high impedance output state, and the switch circuit may set an output from the selection circuit to a predetermined voltage level. When the output enable signal is active, the selection circuit may select and output either one of the output signal from the oscillation circuit and the frequency division signal.

According to the aspect of the invention with this configuration, in a case where the output enable signal is inactive, an output from the selection circuit is fixed to a predetermined voltage level by the switch circuit, and thus a clock signal can be caused to be inactive (a non-output state). On the other hand, in a case where the output enable signal is active, the output signal from the oscillation circuit or the frequency division signal, selected by the selection circuit, is output by the selection circuit, and thus the clock signal can be caused to be active (an output state).

Another aspect of the invention relates to an oscillator including any one of the circuit devices described above; and the resonator.

Still another aspect of the invention relates to an electronic apparatus including any one of the circuit devices described above.

Still another aspect of the invention relates to a vehicle including any one of the circuit devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. The present embodiment described below is not intended to improperly limit the content of the invention disclosed in the appended claims, and all constituent elements described in the present embodiment are not essential as solving means of the invention.

1. Circuit Device

Figure 1:
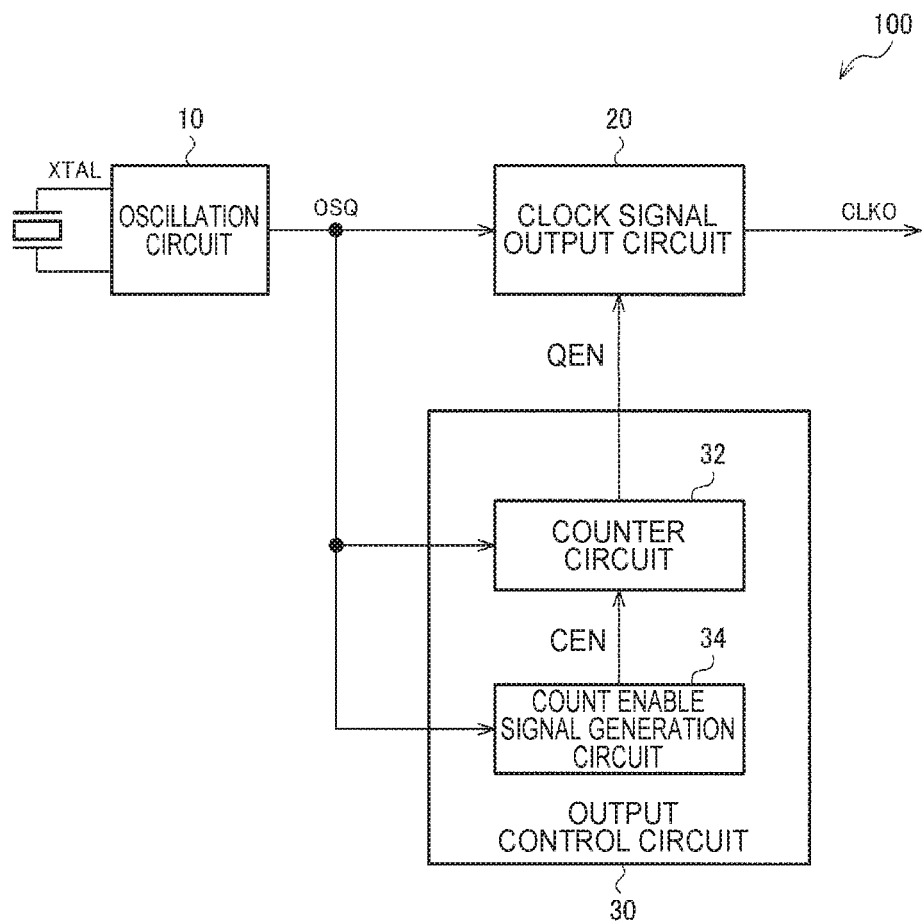
FIG. 1 illustrates a configuration example of a circuit device of the present embodiment.

FIG. 1 illustrates a configuration example of a circuit device 100 of the present embodiment. The circuit device 100 includes an oscillation circuit 10, a clock signal output circuit 20 (output buffer), and an output control circuit 30. The circuit device 100 is implemented by, for example, an integrated circuit device (semiconductor chip). An oscillator is implemented by storing the circuit device 100 and an resonator XTAL in a package. The present embodiment is not limited to the configuration illustrated in FIG. 1, and may be variously modified, for example, some of the constituent elements may be omitted, or other constituent elements may be added thereto.

The oscillation circuit 10 is a circuit which generates an oscillation signal by using the resonator XTAL. Specifically, the oscillation circuit 10 is connected to the resonator XTAL via first and second resonator terminals (resonator pads). The oscillation circuit 10 causes the resonator XTAL to oscillate so as to generate an oscillation signal. For example, in a TCXO or an OCXO, a control voltage (a voltage for compensating for temperature characteristics of an oscillation frequency) corresponding to a detected temperature is input to the oscillation circuit 10, and the oscillation circuit 10 causes the resonator XTAL to oscillate at an oscillation frequency corresponding to the control voltage. Alternatively, in an SPXO, the resonator XTAL oscillates at a natural frequency of the resonator XTAL without performing voltage control for an oscillation frequency. For example, the oscillation circuit 10 includes an oscillation unit (oscillation circuit main body) generating an oscillation signal, and a buffer buffering the oscillation signal and outputting an output signal OSQ.

The resonator XTAL is a piezoelectric resonator such as a quartz crystal resonator. The resonator XTAL may be an oven type resonator (a resonator in an OCXO) provided in a thermostatic tank. Alternatively, the resonator XTAL may be a resonator (an electromechanical resonator or an electrical resonance circuit). As the resonator XTAL, a piezoelectric resonator, a surface acoustic wave (SAW) resonator, a micro electro mechanical systems (MEMS) resonator, or the like may be used. As a substrate material of the resonator XTAL, a piezoelectric single crystal of quartz crystal, Lithium Tantalate, or Lithium Niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The clock signal output circuit 20 outputs a clock signal CLKO on the basis of the output signal OSQ from the oscillation circuit 10. Specifically, the output signal OSQ or a signal obtained by dividing a frequency of the output signal OSQ is buffered (amplified for driving an external load), and the buffered signal is output as the clock signal CLKO. For example, the clock signal output circuit 20 includes a selection circuit which selects either the output signal OSQ and a frequency division signal thereof, and a buffer buffering an output from the selection circuit. The selection circuit may be omitted. The buffer outputs, for example, the clock signal CLKO with a clipped sine wave or a CMOS signal level. The signal with a clipped sine wave is a signal in which upper and lower parts of a sine wave are clipped to predetermined voltage levels (for example, a power source voltage levels).

The output control circuit 30 controls output from the clock signal output circuit 20. In other words, it is controlled whether the clock signal CLKO is brought into an output state (active state) or a non-output state (inactive). In a non-output state, the clock signal output circuit 20 may output the clock signal CLKO with, for example, a fixed voltage level, or may cause an output node (a node from which the clock signal CLKO is output) to be brought into a high impedance state.

The output control circuit 30 includes a counter circuit 32 which performs a counting process on the basis of the output signal OSQ from the oscillation circuit 10, and a count enable signal generation circuit 34 which generates a count enable signal CEN for the counter circuit 32. The counter circuit 32 performs a counting process when the count enable signal CEN becomes active, and outputs an output enable signal QEN for the clock signal CLKO to the clock signal output circuit on the basis of a result of the counting process. Specifically, the count enable signal generation circuit 34 monitors a transitional oscillation state during activation of the oscillation circuit 10, and causes the count enable signal CEN to be active in a case where a monitoring result satisfies a predetermined condition (a condition in which it can be determined that oscillation has grown). The counting process performed by the counter circuit 32 may include a counting operation (counting up or counting down of a count value) performed by a counter and other signal processing (digital signal processing). For example, the counter circuit 32 performs a process of outputting the output enable signal QEN on the basis of a counting operation and a count value therein. The clock signal output circuit 20 outputs the clock signal CLKO (brings the clock signal CLKO to an output state) on the basis of the output signal OSQ in a case where the output enable signal QEN becomes active. The counter circuit 32 may be included in a control circuit (for example, a control circuit 130 in FIG. 14) of the circuit device 100.

Figure 2:
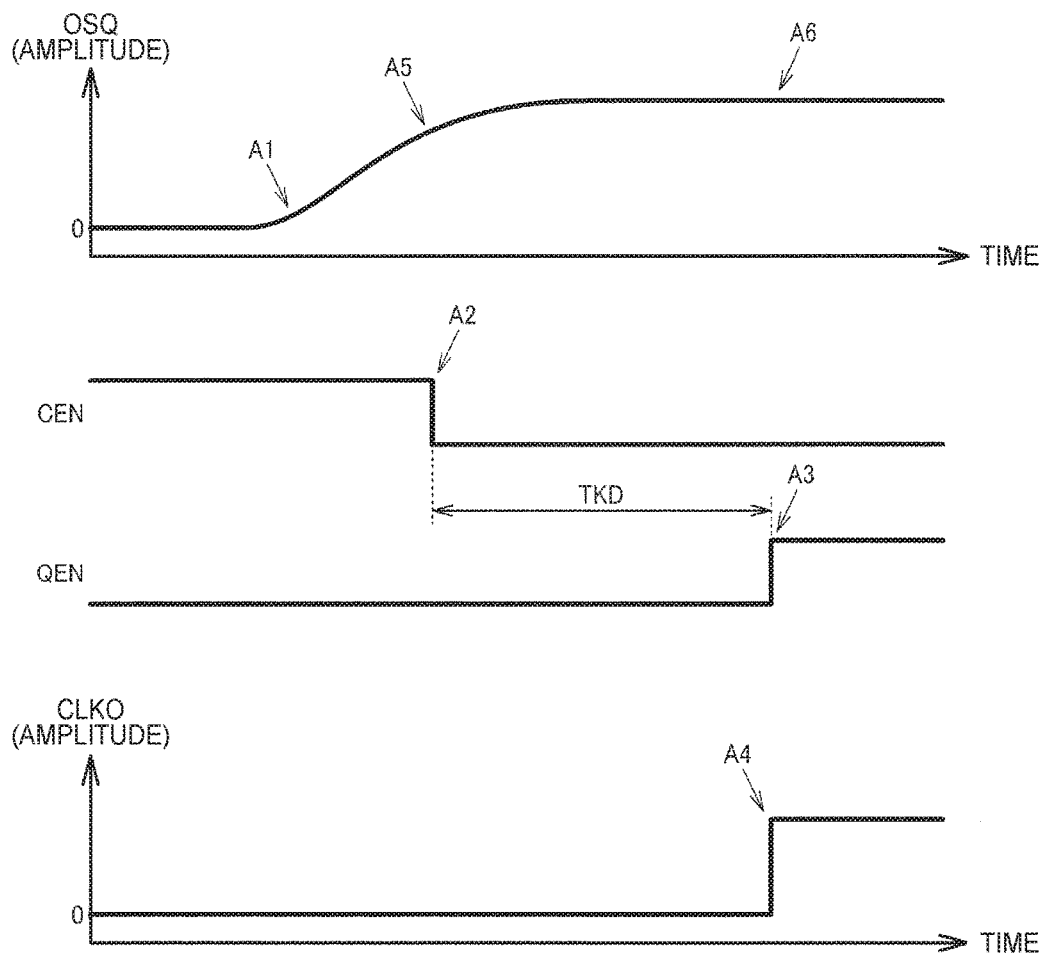
FIG. 2 is a waveform diagram for explaining an operation of the circuit device of the present embodiment.

FIG. 2 is a waveform diagram for explaining an operation of the circuit device 100 of the present embodiment. In FIG. 2, waveforms of the output signal OSQ and the clock signal CLKO are indicated by waveforms of voltage amplitude (peak-to-peak voltage) thereof.

As indicated by A1 in FIG. 2, if the oscillation circuit 10 starts to drive the resonator XTAL, the amplitude of an oscillation signal gradually increases, and the amplitude of the output signal OSQ obtained by buffering the oscillation signal also gradually increases. As indicated by A2, if the amplitude of the output signal OSQ reaches a predetermined level, the count enable signal CEN changes from an inactive state (for example, a high level or a first logic level) to an active state (a low level or a second logic level). If the count enable signal CEN becomes active, the counter circuit 32 performs a counting process. Consequently, as indicated by A3, the output enable signal QEN changes from an inactive state (for example, a low level or a second logic level) to an active state (a high level or a first logic level) after a period TKD elapses from the active state of the count enable signal CEN. The period TKD is a period having a predetermined length provided on the basis of the counting process. If the output enable signal QEN becomes active, as indicated by A4, the clock signal CLKO is output.

Figure 3:
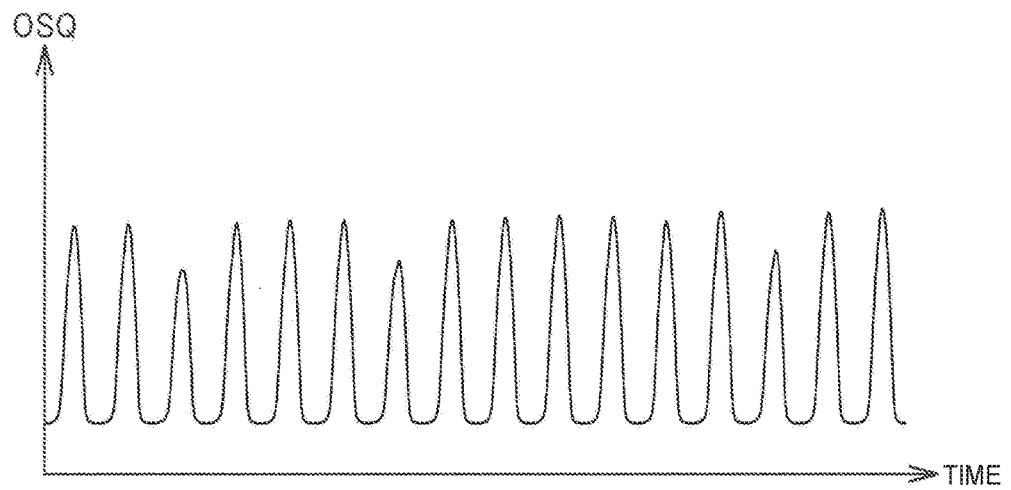
FIG. 3 illustrates a comparative example between waveforms of an output signal from an oscillation circuit and a clock signal.
Figure 3:
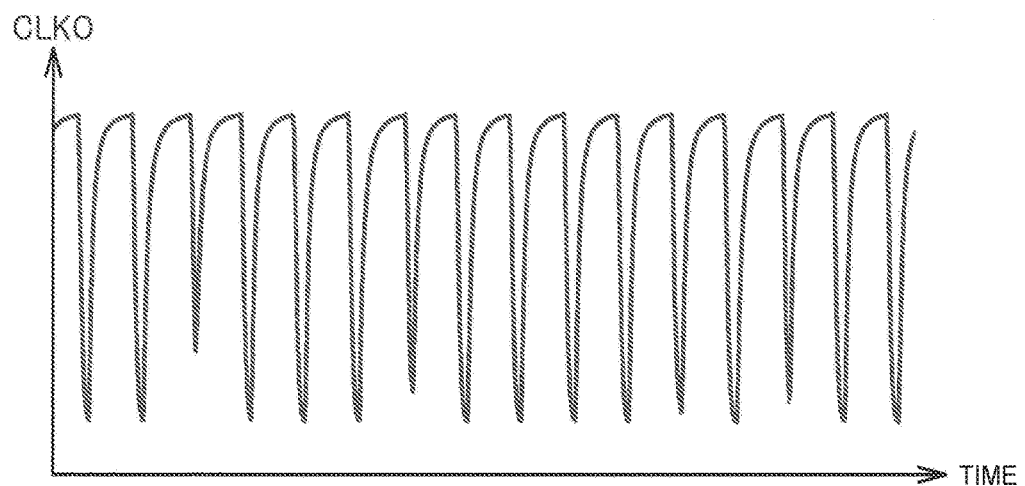

FIG. 3 illustrates a comparative example between waveforms of the output signal OSQ from the oscillation circuit 10 and the clock signal CLKO. FIG. 3 illustrates, for example, waveforms in the process of activation of the oscillation circuit 10 as indicated by A5 in FIG. 2. In the present embodiment, actually, the clock signal CLKO does not start to be output, but, herein, for comparison, the clock signal CLKO is assumed to be output.

In the process of activation of the oscillation circuit 10, the amplitude of the oscillation signal is gradually increasing (since the amplitude does not reach the maximum aspect), the output signal OSQ is a pulsed signal in which a high width is smaller than a low width. A height of the pulse increases as the oscillation amplitude increases. The clock signal CLKO obtained by buffering the output signal OSQ reflects a duty of the output signal OSQ, and thus the duty is greatly deviated from 50%. Here, the duty is a ratio of a high width (a length of a high level period) to a length of one cycle. In the example illustrated in FIG. 3, the clock signal CLKO is obtained by inverting a logic level of the output signal OSQ. In this case, since the duty of the output signal OSQ is considerably smaller than 50%, the duty of the clock signal CLKO becomes considerably smaller than 50%.

In control during activation of an oscillation circuit of the related art, for example, in a case where an oscillation signal is integrated, and an integration voltage reaches a predetermined voltage, a clock signal starts to be output. In such control based on analog processing, it is difficult to secure sufficient time until the duty of a clock signal is stabilized around 50% (until the amplitude of an oscillation signal reaches the maximum amplitude). Thus, there is a probability that the clock signal may start to be output in a state in which the duty thereof is considerably deviated from 50% as illustrated in FIG. 3. The analog processing is easily influenced by a temperature change, a process change, or the like, and thus a duty at the time at which a clock signal starts to be output varies and is thus unlikely to be included in a range of a specification. For example, the time required for the integration voltage to satisfy the condition of reaching a predetermined voltage varies due to the influence of a temperature change, a process change, or the like, and, as a result, a duty of a clock signal may vary.

In relation to this fact, according to the present embodiment, in a case where the count enable signal CEN from the count enable signal generation circuit 34 becomes active, the counter circuit 32 performs a counting process. In a case where the output enable signal QEN becomes active on the basis of the counting process, the clock signal output circuit 20 outputs the clock signal CLKO. Consequently, it is possible to secure sufficient time until the duty (the amplitude of an oscillation signal) of the clock signal is stabilized around 50%. In other words, the count enable signal CEN becomes active at the time at which it is determined that oscillation has grown during activation of the oscillation circuit 10, and the clock signal CLKO can start to be output after the period TKD elapses through the subsequent counting process. The sufficient time for which the duty at the time of starting of outputting of the clock signal CLKO is around 50% is secured thanks to the period TKD. The count enable signal CEN is generated through, for example, analog processing, but, it is possible to reduce the influence of a temperature change, a process change, or the like by combining a counting process (digital processing). In other words, a variation in a duty due to the influence can be reduced, and thus the duty can be included within a range of a specification.

Figure 4:
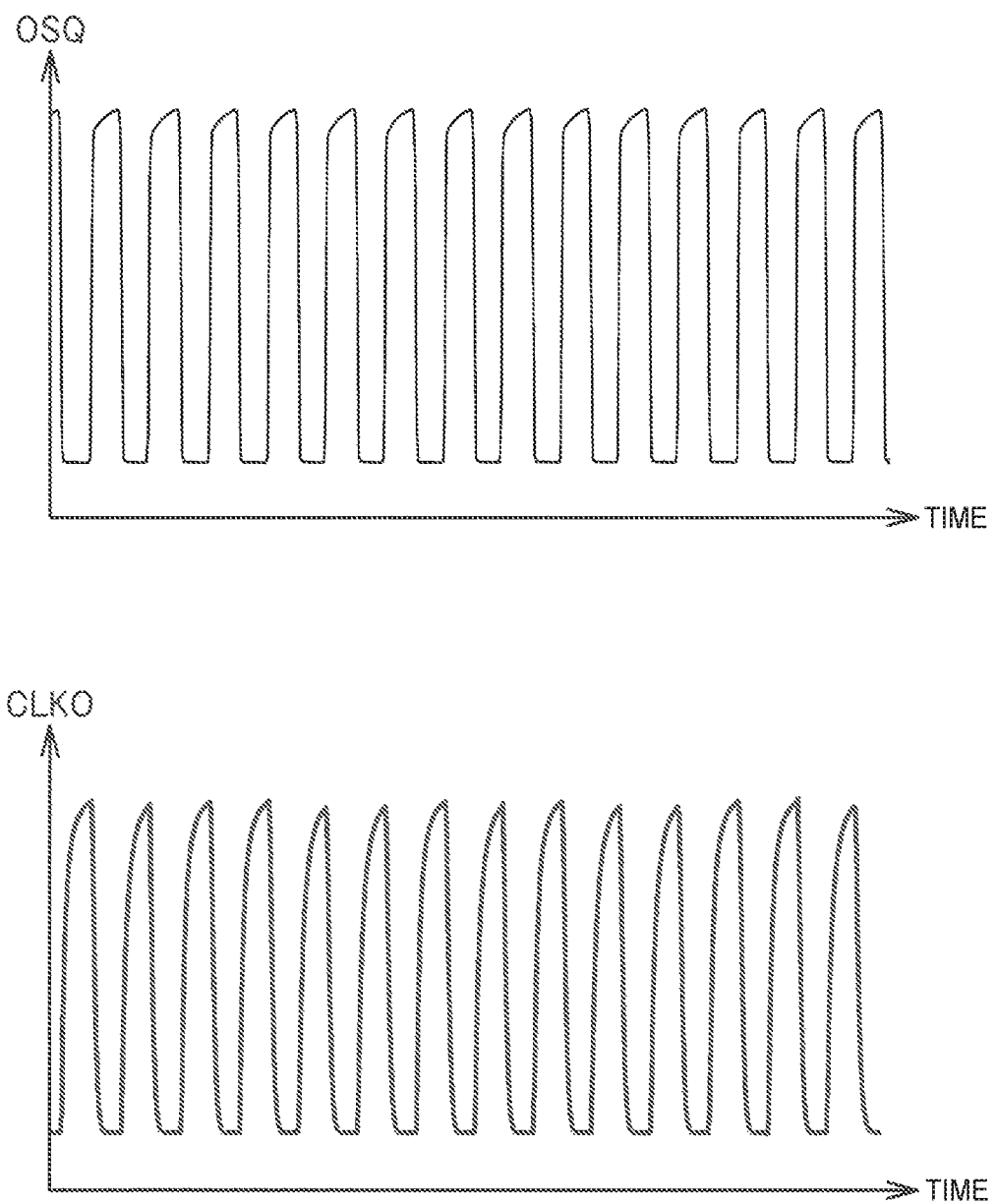
FIG. 4 illustrates examples of waveforms of an output signal from the oscillation circuit and a clock signal in the present embodiment.

FIG. 4 illustrates examples of waveformf of the output signal OSQ from the oscillation circuit 10 and the clock signal CLKO in the present embodiment. FIG. 4 illustrates waveforms, for example, at the time at which oscillation after activation of the oscillation circuit 10 is sufficiently stabilized as indicated by A6 in FIG. 2.

If sufficient time has elapsed from activation of the oscillation circuit 10 (for example, if oscillation amplitude reaches the maximum amplitude), a low width and a high width of the output signal OSQ from the oscillation circuit 10 are substantially the same as each other, and thus a duty thereof becomes around 50%. The clock signal CLKO obtained by buffering the output signal OSQ reflects a duty of the output signal OSQ therein, and thus the duty becomes around 50%.

In the present embodiment, a length of the period TKD in which a duty around 50% (or a range satisfying a specification) can be obtained at the time of starting of outputting of the clock signal CLKO is set by taking into consideration the influence of a temperature change, a process change, or the like. The period TKD is based on a counting process, and thus a length thereof scarcely varies due to a temperature change, a process change, or the like. Thus, even if there is the influence of a temperature change, a process change, or the like, it is possible to output a clock signal with an appropriate duty at the time of starting of outputting of the clock signal CLKO.

As mentioned above, the appropriate clock signal CLKO is realized by combining a counting process compared with a case where control during activation is performed through only analog processing. On the other hand, conversely, a case is assumed in which output control for the clock signal CLKO is performed by only the counter circuit 32. In this case, a counting process is performed by using the output signal OSQ right after activation of the oscillation circuit 10. In other words, the counting process is performed on the basis of the output signal OSQ whose amplitude is considerably small (or a duty is considerably low). Thus, for example, there is a probability that a count value may not change in some pulses of the output signal OSQ (a so-called omission operation), and thus a counting process may not be appropriately performed. If the counting process is not appropriately performed, a timing changes at which the output enable signal QEN becomes active, and thus accurate control cannot be realized.

In relation to this fact, according to the present embodiment, the count enable signal generation circuit 34 generates the count enable signal CEN. Consequently, since the counting process is started after the count enable signal CEN becomes active, the counting process can be started after a state occurs in which the counting process is appropriately performed. Therefore, a change in a timing at which the output enable signal QEN becomes active is reduced, and thus accurate control can be realized.

More specifically, the count enable signal generation circuit 34 generates the count enable signal CEN on the basis of the output signal OSQ from the oscillation circuit 10.

Figure 5:
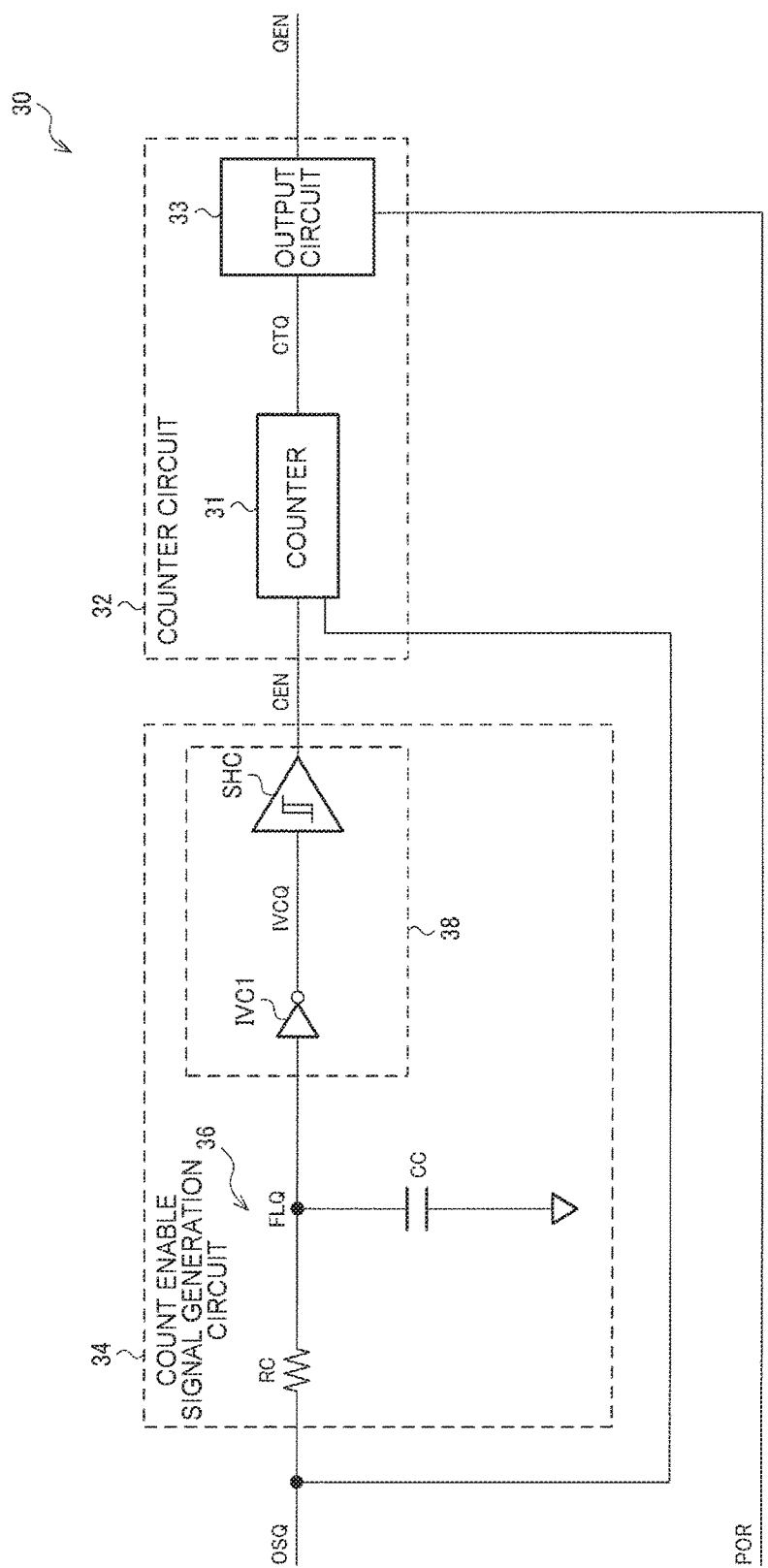
FIG. 5 illustrates a first detailed configuration example of an output control circuit.

As will be described later in FIG. 5 or the like, the count enable signal generation circuit 34 may include an analog circuit (for example, a filter) which performs analog processing on the output signal OSQ, and a determination unit (for example, a logic inversion circuit or a Schmitt trigger circuit) which determines whether or not the count enable signal CEN becomes active on the basis of an output from the analog circuit.

As mentioned above, the count enable signal CEN is generated through, for example, analog processing on the basis of the output signal OSQ from the oscillation circuit 10, and thus a counting process can be started on the basis of the output signal OSQ. In other words, in a case where the output signal OSQ satisfies a predetermined condition (for example, an output from the analog circuit has a predetermined signal level), a counting process can be started. Consequently, after the amplitude or the duty of the output signal OSQ is brought into a state in which a counting process can be appropriately performed, the counting process can be started, and thus it is possible to appropriately perform the counting process.

In the present embodiment, the counter circuit 32 starts a counting process in a case where the count enable signal CEN becomes active. The counter circuit 32 causes the output enable signal QEN to be active in a case where a count value in the counting process reaches a predetermined set value. In other words, a length of the period TKD described in FIG. 2 is a length of a period from starting of counting of the number of pulses of the output signal OSQ until a count value thereof becomes a predetermined set value. For example, the counter circuit 32 may include a linear feedback shift register, and may output any one bit (for example, the most significant bit) of binary data (count value) as the output enable signal QEN. Alternatively, the counter circuit 32 may include a counter and a determination unit, and the determination unit compares a count value from the counter with a predetermined set value, and may cause the output enable signal QEN to be active in a case where it is determined that the count value matches the predetermined set value.

In the above-described way, the period TKD, until outputting of the clock signal CLKO is started after the count enable signal CEN becomes active, is controlled according to counting of the number of pulses of the output signal OSQ (oscillation signal). An oscillation frequency of the resonator XTAL is specific to the resonator XTAL, and thus the period TKD is scarcely influenced by an environmental temperature, a process change, or the like. Consequently, the appropriate period TKD without depending on an environmental temperature, a process change, or the like is realized.

The predetermined set value may be set in a hardware manner (for example, in a case of the above-described linear feedback shift register), or may be set through register setting. Alternatively, the predetermined set value may be set by using information written into a nonvolatile memory during manufacturing. Alternatively, the predetermined set value may be generated inside the circuit device 100 (for example, in a case of using a temperature sensor which will be described later).

2. First Detailed Configuration Example of Output Control Circuit

Hereinafter, a description will be made of details of each unit of the circuit device 100. FIG. 5 illustrates a first detailed configuration example of the output control circuit 30. In FIG. 5, the count enable signal generation circuit 34 includes a smoothing circuit 36 (smoothing filter) and a detection circuit 38. The counter circuit 32 includes a counter 31 and an output circuit 33. The present embodiment is not limited to the configuration illustrated in FIG. 5, and may be variously modified, for example, some of the constituent elements may be omitted, or other constituent elements may be added thereto.

First, a description will be made of the count enable signal generation circuit 34. The smoothing circuit 36 smooths the output signal OSQ from the oscillation circuit 10, and outputs the smoothed signal as an output signal FLQ. Specifically, the smoothing circuit 36 reduces a component around an oscillation frequency of the oscillation circuit 10 from the output signal OSQ, and outputs a DC signal (with a bandwidth sufficiently lower than the oscillation frequency). For example, the smoothing circuit 36 is a low-pass filter having a cutoff frequency which is sufficiently lower than (for example, ⅕ or less) the oscillation frequency. In the example illustrated in FIG. 5, the smoothing circuit 36 includes a resistive element RC and a capacitor CC, and is a primary passive low-pass filter. The smoothing circuit 36 is not limited thereto, and may be a secondary or higher filter or an active filter.

As mentioned above, the output signal OSQ from the oscillation circuit 10 is smoothed and is converted into a DC signal, and thus an oscillation state (the growth extent of oscillation during activation) of the oscillation circuit 10 can be monitored. In other words, since a voltage level (signal level) of the output signal FLQ from the smoothing circuit 36 changes depending on oscillation amplitude, and thus the voltage level can be used as a monitoring signal.

The detection circuit 38 performs a detection operation on the basis of the output signal FLQ from the smoothing circuit 36, and outputs the count enable signal CEN. In other words, the detection circuit 38 performs a detection operation of a voltage level of the output signal FLQ on the basis of the output signal FLQ, and monitors the growth extent of oscillation. The count enable signal CEN is generated on the basis of a detection result thereof.

As described above, a voltage level of the output signal FLQ from the smoothing circuit 36 changes depending on oscillation amplitude. Thus, it is possible to detect that oscillation amplitude occurs in which a counting process can be started by performing a detection operation on the basis of the output signal FLQ, and thus to cause the count enable signal CEN to be active on the basis of a detection result thereof.

Specifically, the detection circuit 38 causes the count enable signal CEN to be active in a case where a voltage level of the output signal FLQ from the smoothing circuit 36 exceeds a predetermined voltage level. For example, the predetermined voltage level is higher than ½ (preferably, ⅔, and, more preferably ¾) of a voltage level of the output signal FLQ corresponding to the maximum oscillation amplitude.

As oscillation in the oscillation circuit 10 grows, and thus the amplitude of the output signal OSQ increases, a voltage level of the output signal FLQ from the smoothing circuit 36 is heightened. Thus, by detecting that a voltage level of the output signal FLQ exceeds a predetermined voltage level, the count enable signal CEN can be caused to be active in a case where oscillation has grown to desired oscillation amplitude.

The detection circuit 38 includes a logic inversion circuit IVC1 and a Schmitt trigger circuit SHC. The output signal FLQ from the smoothing circuit 36 is input to the logic inversion circuit IVC1. For example, the logic inversion circuit IVC1 is an inverter, but is not limited thereto, and may be a NAND circuit (in a case where one of inputs is "1") or a NOR circuit (in a case where one of inputs is "0"). An output signal IVCQ from the logic inversion circuit IVC1 is input to the Schmitt trigger circuit SHC, and then the count enable signal CEN is output.

In the above-described way, when a voltage level of the output signal FLQ from the smoothing circuit 36 exceeds a logical threshold value of the logic inversion circuit IVC1, a logic level of the output signal IVCQ from the logic inversion circuit IVC1 changes from a high level to a low level. In other words, since the output signal FLQ from the smoothing circuit 36 is input to the logic inversion circuit IVC1, it can be determined whether or not a voltage level of the output signal FLQ exceeds a predetermined voltage level (logical threshold value).

A component of an oscillation frequency may remain or noise may be included in the output signal FLQ from the smoothing circuit 36. Thus, a change in the output signal IVCQ from the logic inversion circuit IVC1 may not generate a single edge (a logic level varies, or a logic level of the output signal IVCQ repeats a high level and a low level around a logical threshold value). In relation to this fact, in the present embodiment, the count enable signal CEN can be appropriately changed from a high level (inactive) to a low level (active) by using the Schmitt trigger circuit SHC.

Driving performance of the logic inversion circuit IVC1 is set to be considerably low. In other words, the logic inversion circuit IVC1 is formed of a small-sized transistor (having small W/L). Specifically, the logic inversion circuit IVC1 is set to have driving performance capable of reducing an oscillation frequency component, so as to be able to reduce an oscillation frequency component included in the output signal FLQ from the smoothing circuit 36. Consequently, it is possible to reduce a variation in a logic level of the output signal IVCQ from the logic inversion circuit IVC1.

Next, a description will be made of the counter circuit 32. The counter 31 of the counter circuit 32 performs a counting operation on the basis of the output signal OSQ from the oscillation circuit 10. Specifically, the counter 31 counts the number of pulses of the output signal OSQ. For example, the counter 31 is formed of a simple shift register, or a linear feedback shift register. An internal signal of the shift register or the linear feedback shift register is output as an output signal CTQ. Alternatively, the counter 31 may further include a decoder, and the decoder may decode a count value so as to output the output signal CTQ. The output signal CTQ is a signal which changes from an inactive state (a high level or a first logic level) to an active state (a low level or a second logic level) in a case where a count value becomes a predetermined set value.

The output circuit 33 causes the output enable signal QEN to be inactive in a case where a reset signal POR is active (a reset state; for example, a low level). The output circuit 33 causes the output enable signal QEN to be active in a case where the reset signal POR becomes inactive (a reset cancel state; for example, a high level), and then the output signal CTQ from the counter 31 becomes active. The reset signal POR is, for example, a power-on reset signal, a reset signal supplied from an external device (a CPU or the like) of the circuit device 100, or a reset signal generated by a control circuit of the circuit device 100.

If the reset signal POR becomes inactive, the oscillation circuit 10 is activated (starts oscillation), then the count enable signal CEN becomes active, the output signal CTQ from the counter 31 becomes active, and the output enable signal QEN becomes active by the output circuit 33. Consequently, the count enable signal generation circuit 34 can be operated (only) in a case where the oscillation circuit 10 is activated, and thus the output enable signal QEN can be caused to be active after the time required to obtain the clock signal CLKO having an appropriate duty elapses.

The output circuit 33 is, for example, a reset-set latch (RS latch). In other words, in a case where the reset signal POR is active, the RS latch is in a reset state, and the output enable signal QEN is maintained to be inactive. On the other hand, if the reset signal POR becomes inactive, the reset state of the RS latch is canceled, and, in a case where the output signal CTQ from the counter 31 is inactive, the output enable signal QEN is inactive. If the output signal CTQ becomes active, the RS latch performs a latch operation so that the output enable signal QEN becomes active.

An operation of the output circuit 33 is performed by using the RS latch as mentioned above. In other words, in a case where the output signal CTQ from the counter 31 becomes active after the reset signal POR becomes inactive, the output enable signal QEN can be caused to be active.

The output circuit 33 is not limited to an RS latch, and may be, for example, a latch circuit which performs a latch operation on the basis of a clock signal. In this case, for example, a latch operation may be performed on the basis of the output signal OSQ from the oscillation circuit 10. Alternatively, the output circuit 33 may be a processing circuit (logic circuit) which performs some signal processing on the output signal CTQ from the counter 31 so as to output the output enable signal QEN.

3. Second Detailed Configuration Example of Output Control Circuit

Figure 6:
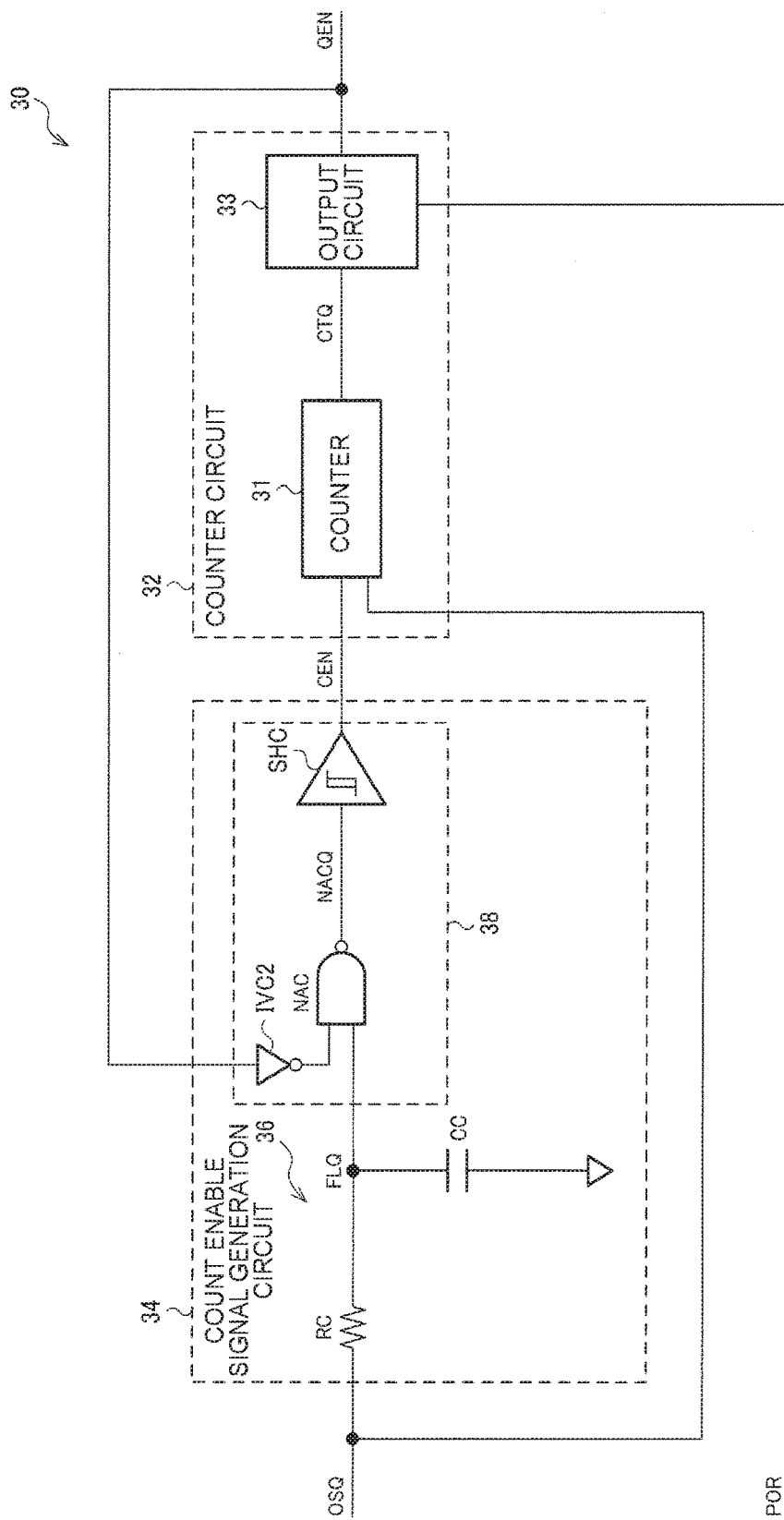
FIG. 6 illustrates a second detailed configuration example of an output control circuit.

FIG. 6 illustrates a second detailed configuration example of the output control circuit 30. In FIG. 6, the detection circuit 38 of the count enable signal generation circuit 34 includes an inverter IVC2, a NAND circuit NAC, and a Schmitt trigger circuit SHC. The present embodiment is not limited to the configuration illustrated in FIG. 6, and may be variously modified, for example, some of the constituent elements may be omitted, or other constituent elements may be added thereto.

In the present embodiment, the detection circuit 38 causes the count enable signal CEN to be inactive in a case where the output enable signal QEN becomes active. Specifically, the output signal FLQ from the smoothing circuit 36, and a signal obtained through logic inversion of the output enable signal QEN in the inverter IVC2 are input to the NAND circuit NAC, and an output signal NACQ from the NAND circuit NAC is input to the Schmitt trigger circuit SHC.

In the above-described way, an operation of the counter circuit 32 (output control circuit 30) can be disabled through feedback from the output enable signal QEN to the count enable signal CEN in a case where the output enable signal QEN changes from an inactive state to an active state. If the clock signal CLKO starts to be output after activation of the oscillation circuit 10, output control for the clock signal CLKO is not necessary, and thus an operation of the counter circuit 32 may be disabled as in the present embodiment. Wasteful power consumption can be reduced by disabling an operation of the counter circuit 32, and thus it is possible to reduce power consumption of the circuit device 100.

Figure 7:
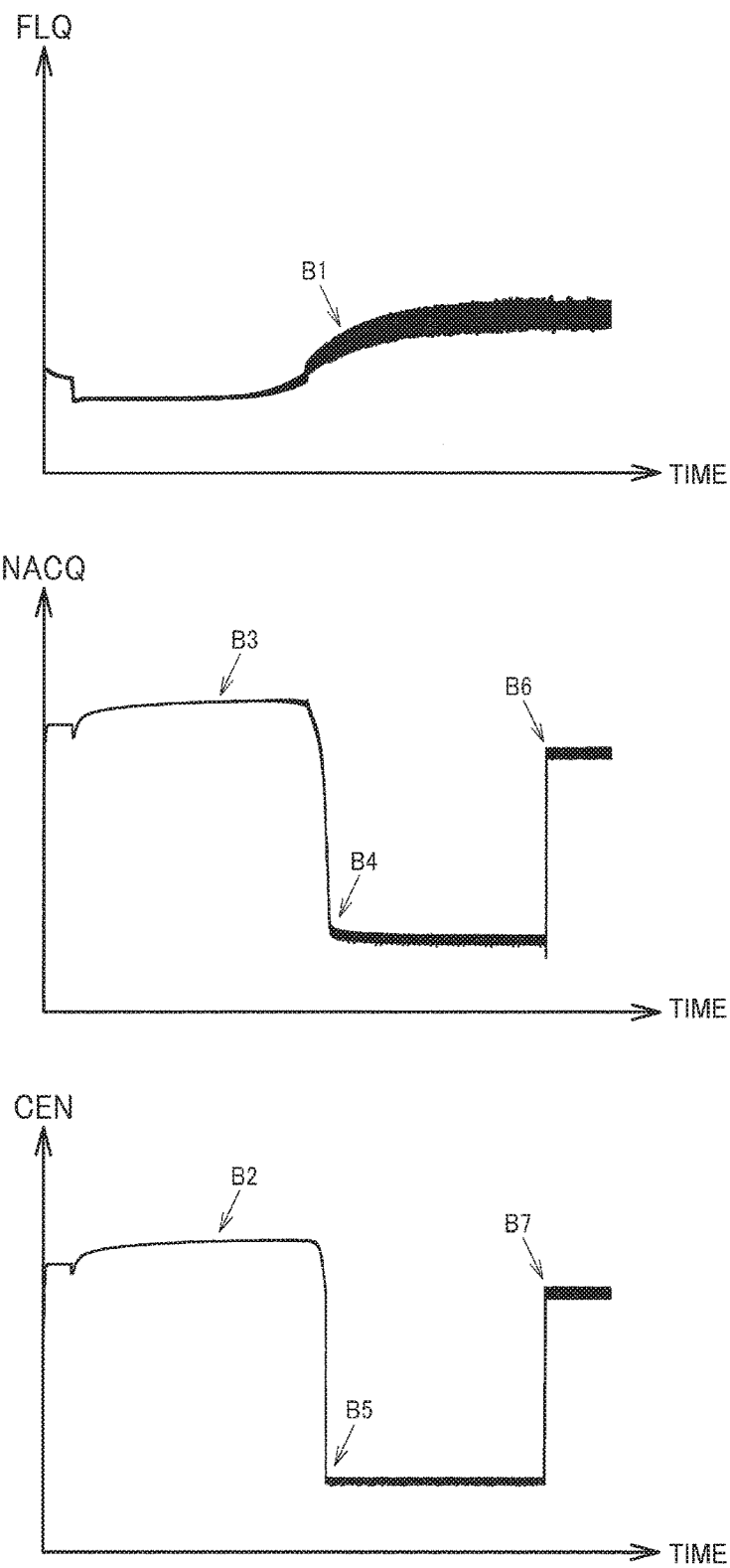
FIG. 7 illustrates waveform examples for explaining an operation of the output control circuit in the second detailed configuration example.

FIG. 7 is a waveform example (voltage waveform example) for explaining an operation of the output control circuit 30 in FIG. 6.

As indicated by B1 in FIG. 7, a voltage level of the output signal FLQ from the smoothing circuit 36 increases as the amplitude of the output signal OSQ from the oscillation circuit 10 increases. An oscillation frequency component is attenuated by the smoothing circuit 36, but a part thereof passes through the smoothing circuit 36, and thus the output signal FLQ resonates at an oscillation frequency.

When the reset signal POR changes from an active state to an inactive state (when the oscillation circuit 10 is activated), the output enable signal QEN is in a low level (inactive). A voltage level of the output signal FLQ from the smoothing circuit 36 is a low level in terms of a logic level until the voltage level exceeds a logical threshold value, and thus the output signal NACQ from the NAND circuit NAC has a high level as indicated by B3.

If the voltage level of the output signal FLQ from the smoothing circuit 36 exceeds the logical threshold value, the output signal NACQ from the NAND circuit NAC changes from a high level to a low level as indicated by B4. An oscillation frequency component remains in the output signal FLQ from the smoothing circuit 36, but the driving performance of the NAND circuit NAC deteriorates. Therefore, the NAND circuit NAC functions as a kind of low-pass filter, and thus the occurrence of a spike in the output signal NACQ is prevented. If the output signal NACQ from the NAND circuit NAC changes from a high level to a low level, as indicated by B5, the count enable signal CEN which is an output signal from the Schmitt trigger circuit SHC changes from a high level (inactive) to a low level (active).

If a count value in the counter 31 reaches a predetermined set value, and thus the output enable signal QEN changes from a low level (inactive) to a high level (active), as indicated by B6, the output signal NACQ from the NAND circuit NAC changes from a low level to a high level. Consequently, as indicated by B7, the count enable signal CEN changes from a low level (active) to a high level (inactive).

4. Counter

Figure 8:
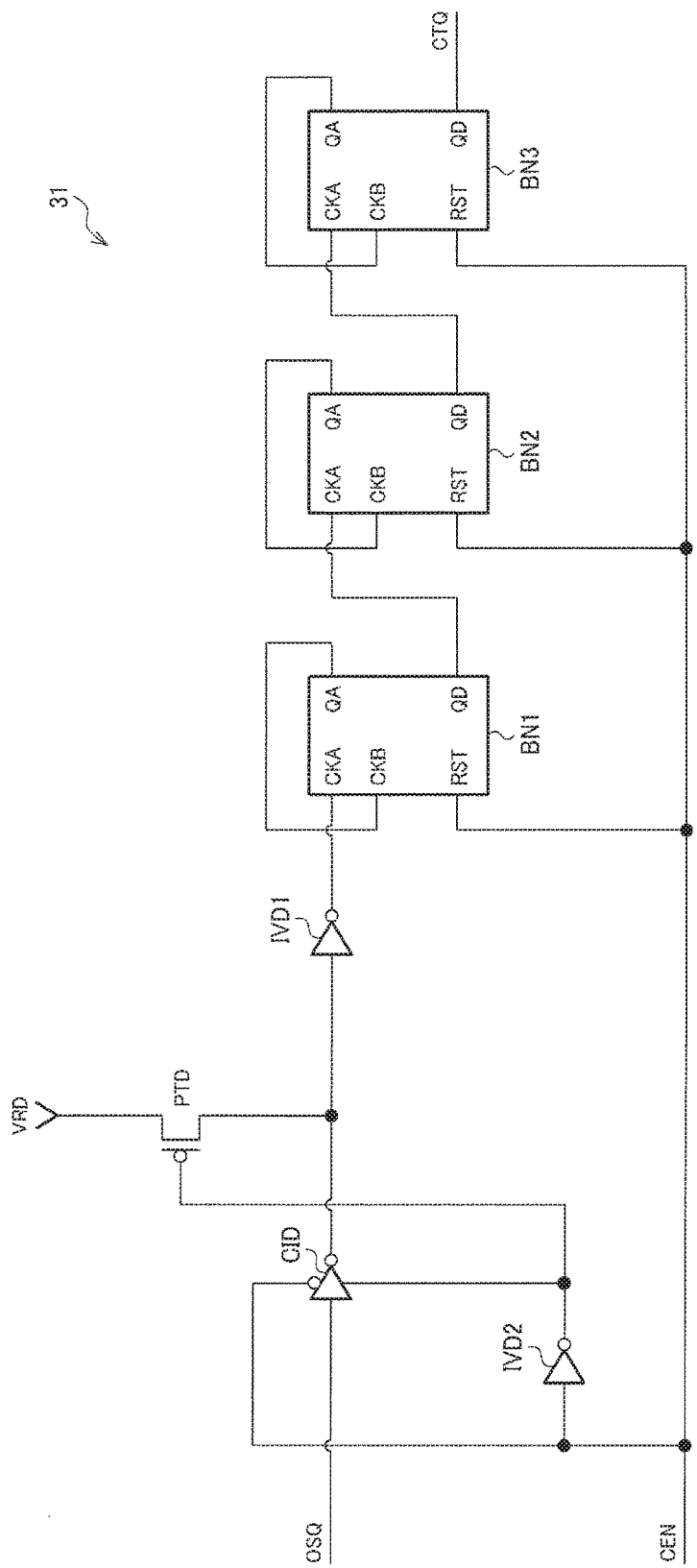
FIG. 8 illustrates a detailed configuration example of a counter.

FIG. 8 illustrates a detailed configuration example of the counter 31. The counter 31 includes a clocked inverter CID, inverters IVD1 and IVD2, a transistor PTD (a P type transistor or a first conductivity type transistor), and division circuits BN1 to BN3. The present embodiment is not limited to the configuration illustrated in FIG. 8, and may be variously modified, for example, some of the constituent elements may be omitted, or other constituent elements may be added thereto.

In a case where the count enable signal CEN has a high level (inactive), the division circuits BN1 to BN3 are in a reset state. An output from the clocked inverter CID is brought into a high impedance state so that the transistor PTD is turned on, and an input of the inverter IVD1 changes to a voltage level (high level) of a power source VRD. In other words, the output signal OSQ from the oscillation circuit 10 is not input to the division circuits BN1 to BN3. As mentioned above, in a case where the count enable signal CEN has a high level, the counter 31 is in a non-operation state.

If the count enable signal CEN changes to a low level (active), a reset state of the division circuits BN1 to BN3 is canceled, and thus the division circuits BN1 to BN3 are brought into an operation state. The transistor PTD is turned off, and the output signal OSQ from the oscillation circuit 10 is input to the division circuit BN1 via the clocked inverter CID and the inverter IVD1. Consequently, the division circuits BN1 to BN3 are operated on the basis of the output signal OSQ from the oscillation circuit 10.

Each of the division circuits BN1 to BN3 divides a frequency of a clock signal which is input as a clock signal CKA by 10 (a frequency is reduced to 1/10). In other words, each of the division circuits BN1 to BN3 is a decimal counter. In all of the division circuits BN1 to BN3, a frequency of the output signal OSQ from the oscillation circuit 10 is divided by 10×10×10=1000. However, an output signal QD from each of the division circuits BN1 to BN3 has a high level up to an eighth cycle among 10 division cycles, and changes to a low level from a ninth cycle. The count enable signal CEN which is the output signal QD from the division circuit BN3 has a high level up to 10×10×8=800-th cycle of the output signal OSQ from the oscillation circuit 10, and changes to a low level from a 801st cycle. In other words, the division circuits BN1 to BN3 are a 800ary counter as a whole thereof.

Figure 9:
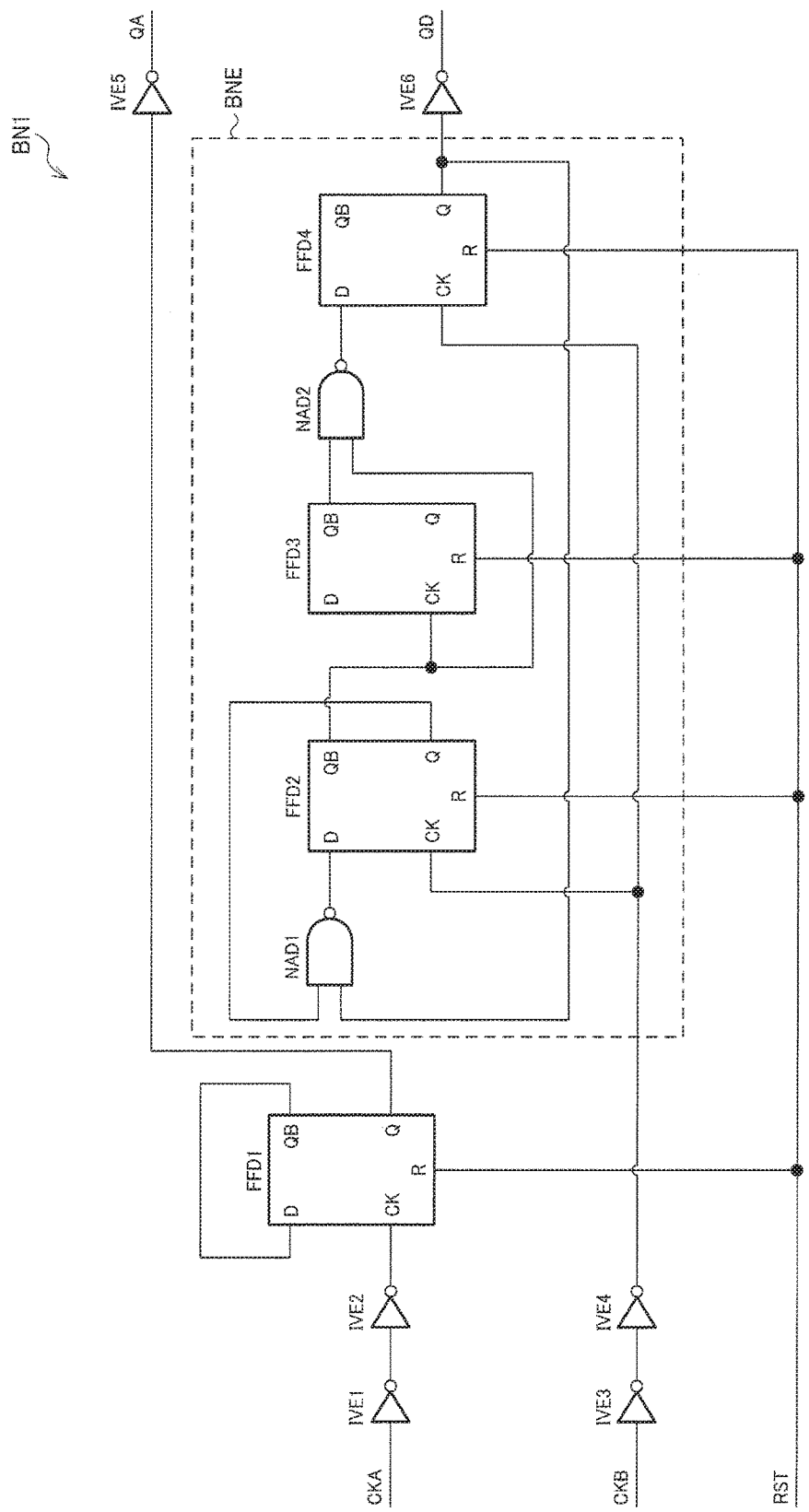
FIG. 9 is a detailed configuration example of a division circuit.

FIG. 9 illustrates a detailed configuration example of the division circuit BN1. The division circuits BN2 and BN3 have the same configuration. The division circuit BN1 includes inverters IVE1 to IVE6, a flip-flop circuit FFD1, and a division circuit BNE. The division circuit BNE includes NAND circuits NAD1 and NAD2, and flip-flop circuits FFD2 to FFD4.

The flip-flop circuit FFD1 is a circuit (binary counter) which feeds back an inversion output signal QB as an input signal D, and divides a frequency of a clock signal CKA by 2. In other words, an output signal QA from the inverter IVE5 is a clock signal obtained by dividing a frequency of the clock signal CKA by 2. As illustrated in FIG. 8, the output signal QA from the division circuit BN1 is fed back as a clock signal CKB.

As illustrated in FIG. 9, the division circuit BNE is operated on the basis of the clock signal CKB. The division circuit BNE is a circuit (pentatonic counter) which divides a frequency of the clock signal CKB by 5 through feedback or signal processing in the NAND circuits NAD1 and NAD2. In other words, if the flip-flop circuit FFD1 and the division circuit BNE are combined together, this corresponds to a circuit (decimal counter) which divides a frequency of the clock signal CKA by 2×5=10, and the output signal QD from the inverter IVE6 is a signal obtained by dividing a frequency of the clock signal CKA by 10. The output signal from the division circuit BNE has a low level up to a fourth cycle among five division cycles, and changes to a high level from a fifth cycle. In other words, the output signal QD from the inverter IVE6 has a high level up to an eighth cycle among ten division cycles of the clock signal CKA, and changes to a low level from a ninth cycle.

5. Modification Examples of Output Control Circuit

Figure 10:
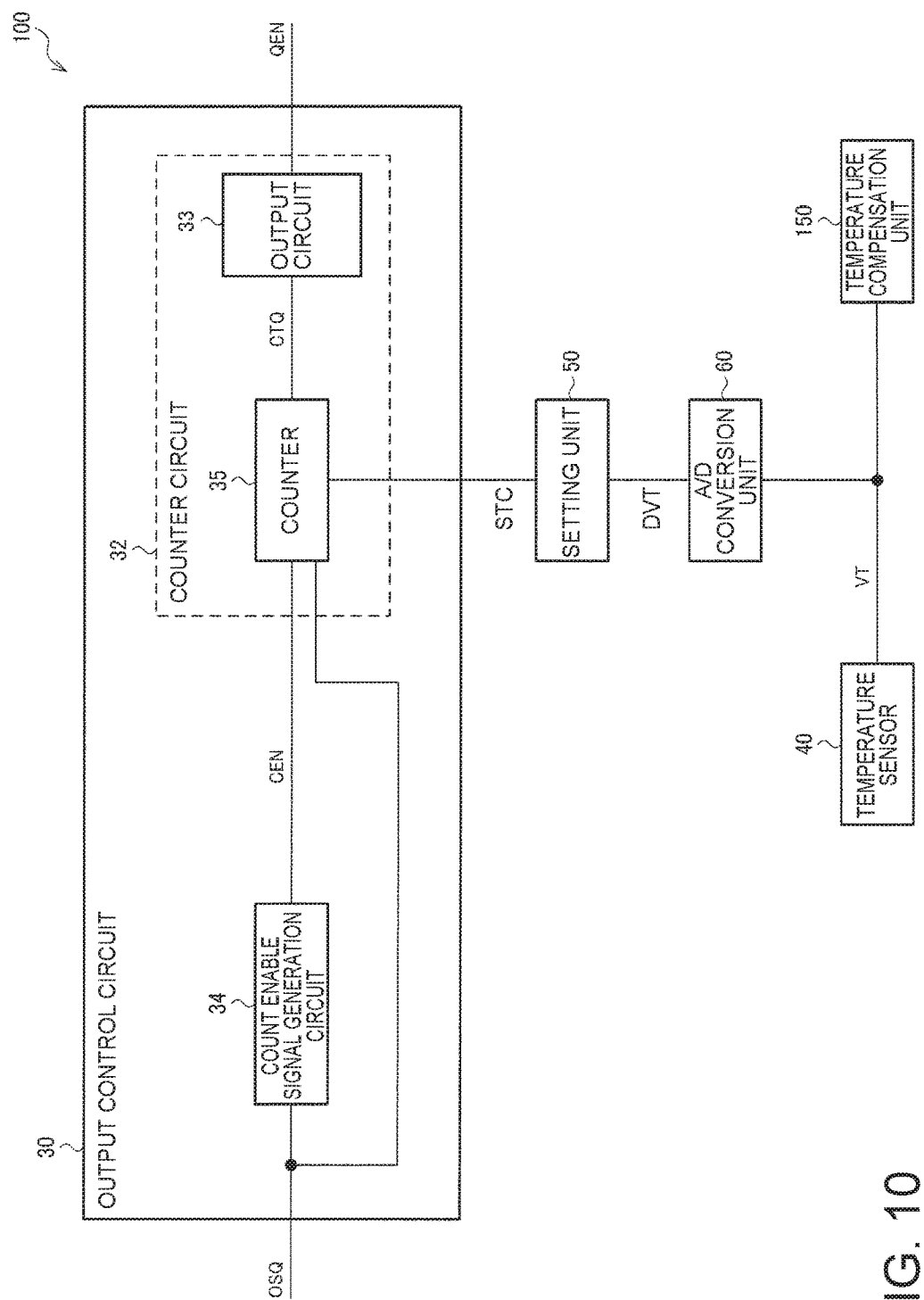
FIG. 10 illustrates a modification example of the output control circuit, and a configuration example of the circuit device in a case where the modification example is applied.

FIG. 10 illustrates a modification example of the output control circuit 30, and a configuration example of the circuit device 100 in a case where the modification example is applied. In FIG. 10, the circuit device 100 includes an output control circuit 30, a temperature sensor 40, a setting unit 50, an A/D converter 60, and a temperature compensation unit 150 (temperature compensation circuit). The counter circuit 32 of the output control circuit 30 includes a counter 35 and an output circuit 33. The present embodiment is not limited to the configuration illustrated in FIG. 10, and may be variously modified, for example, some of the constituent elements may be omitted, or other constituent elements may be added thereto. For example, the temperature sensor 40 or the A/D converter 60 may be provided outside the circuit device 100.

As described above, the counter circuit 32 causes the output enable signal QEN to be active in a case where a count value in the counting process reaches a predetermined set value. In the present modification example, the predetermined set value is variable. In other words, the setting unit 50 sets a set value STC to be variable, and outputs the set value STC to the counter 35. The counter 35 compares a count value with the set value STC, and causes the output enable signal QEN (output signal CTQ) to be active in a case where it is determined that the count value reaches the set value STC.

Time, until the appropriate clock signal CLKO (for example, a clock signal having an appropriate duty) is obtained from activation of the oscillation circuit 10, may change due to an environmental factor or the like. In relation to this fact, according to the present modification example, appropriate predetermined set values (that is, the period TKD in FIG. 2) may be set according to various environmental factors or the like.

For example, in the present modification example, the predetermined set value is set to be variable according to an environmental temperature (a temperature detected by the temperature sensor 40) of the circuit device 100. Specifically, the temperature compensation unit 150 performs temperature compensation on an oscillation frequency in the oscillation circuit 10 on the basis of a temperature detection signal VT from the temperature sensor 40. In a case of performing temperature compensation, the predetermined set value is set to be variable on the basis of the temperature detection signal VT. In FIG. 10, the A/D converter 60 performs A/D conversion on a voltage level of the temperature detection signal VT, and outputs temperature detection data DVT as a result of the A/D conversion. The setting unit 50 outputs the set value STC on the basis of the temperature detection data DVT. For example, the set value STC is output by referring to a lookup table in which the temperature detection data DVT is correlated with the set value STC. Alternatively, a calculation process of obtaining the set value STC on the basis of the temperature detection data DVT may be performed, and the set value STC may be output.

If an environmental temperature (for example, a temperature of the resonator XTAL) changes, time for the appropriate clock signal CLKO to be obtained from activation of the oscillation circuit 10 changes. In relation to this fact, according to the present modification example, an appropriate predetermined set value (that is, the period TKD in FIG. 2) may be set on the basis of the temperature detection signal VT from the temperature sensor 40. For example, as a temperature becomes higher, the predetermined set value becomes greater so that the period in FIG. 2 is increased.

In the above description, a description has been made of an example in which a predetermined set value is set to be variable according to an environmental temperature, but this is only an example. There may be setting methods according to various environmental factors, for example, a predetermined set value is set to be variable according to an individual difference (a process change or the like) of the resonator XTAL or the circuit device 100. In the above description, a description has been made of an example of a case where the setting unit 50 sets the predetermined set value on the basis of a temperature detected by the temperature sensor 40, but this is only an example. For example, the predetermined set value may be set to be variable through register setting from an external device (a CPU or the like) of the circuit device 100. Alternatively, the predetermined set value may be set to be variable by writing the predetermined set value into a nonvolatile memory during manufacturing.

6. Clock Signal Output Circuit

Figure 11:
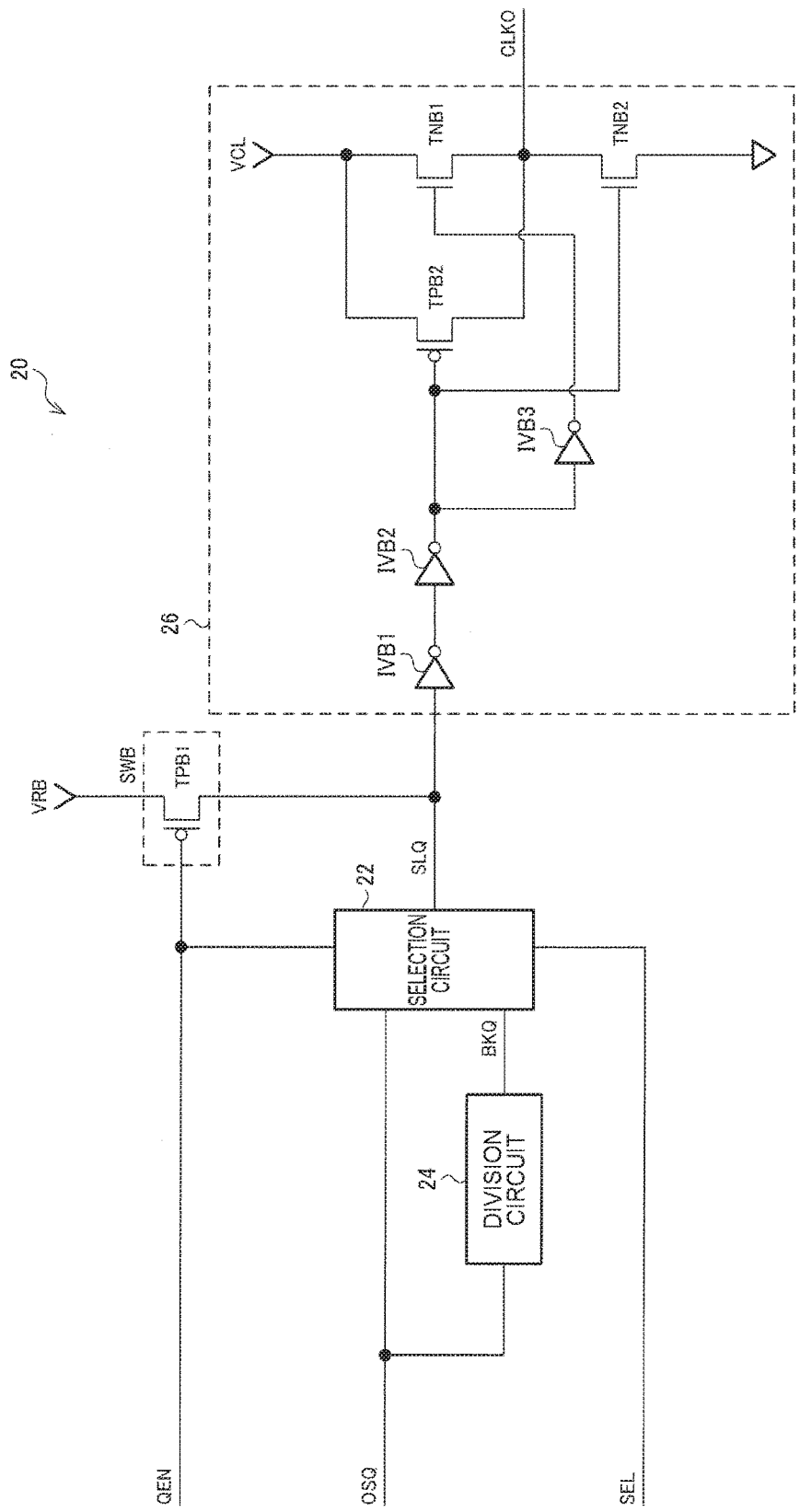
FIG. 11 illustrates a detailed configuration example of a clock signal output circuit.

FIG. 11 illustrates a detailed configuration example of the clock signal output circuit 20. The clock signal output circuit 20 includes a selection circuit 22 (selector), a division circuit 24, an output buffer 26, and a switch circuit SWB.

The division circuit 24 divides a frequency of the output signal OSQ from the oscillation circuit 10, and outputs a signal having frequency division as a frequency division signal BKQ. For example, a division ratio of the division circuit 24 is ½ or ¼. In a case where the output enable signal QEN is inactive, the selection circuit 22 is in a high impedance output state, and the switch circuit SWB sets an output (output signal SLQ) from the selection circuit 22 to a predetermined voltage level. For example, the predetermined voltage level is a voltage level of a power source VRB (a high potential side power source). In a case where the output enable signal QEN is active, the selection circuit 22 selects one of the output signal OSQ from the oscillation circuit 10 and the frequency division signal BKQ, and outputs the selected signal as the output signal SLQ.

Specifically, the switch circuit SWB is a transistor TPB1 (a P type transistor or a first conductivity type transistor). In a case where the output enable signal QEN has a low level (active), the transistor TPB1 is turned off, and a signal selected by the selection circuit 22 is input to the output buffer 26.

In a case where the output enable signal QEN is active, the selection circuit 22 selects one of the output signal OSQ from the oscillation circuit 10 and the frequency division signal BKQ on the basis of a selection signal SEL. The selection signal SEL is input from a control circuit (for example, the control circuit 130 in FIG. 14) of the circuit device 100. For example, information regarding the selection signal SEL is stored in a nonvolatile memory during manufacturing, and the control circuit outputs the selection signal SEL on the basis of the information.

The output buffer 26 includes inverters IVB1 to IVB3, and a transistor TPB2 (a P type transistor or a first conductivity type transistor), transistors TNB1 and TNB2 (an N type transistor or a second conductivity type transistor). In the output buffer 26, the transistors TPB2, TNB1 and TNB2 drive a load so as to output the clock signal CLKO. A voltage of a power source VCL of the transistors is a low voltage such as about 1 V. Thus, the transistors TPB2 and TNB1 are connected in parallel to each other (as in a transfer gate), and driving performance is ensured. As described above, the output buffer 26 outputs the clock signal CLKO with a clipped sine wave.

According to the present embodiment, in a case where the output enable signal QEN is inactive, an input voltage level of the output buffer 26 is fixed by the switch circuit SWB, and thus the clock signal CLKO can be caused to be inactive (a non-output state). On the other hand, in a case where the output enable signal QEN is active, the output signal OSQ from the oscillation circuit 10 or the frequency division signal BKQ, selected by the selection circuit 22, is input to the output buffer 26, and thus the clock signal CLKO can be caused to be active (an output state).

7. Selection Circuit

Figure 12:
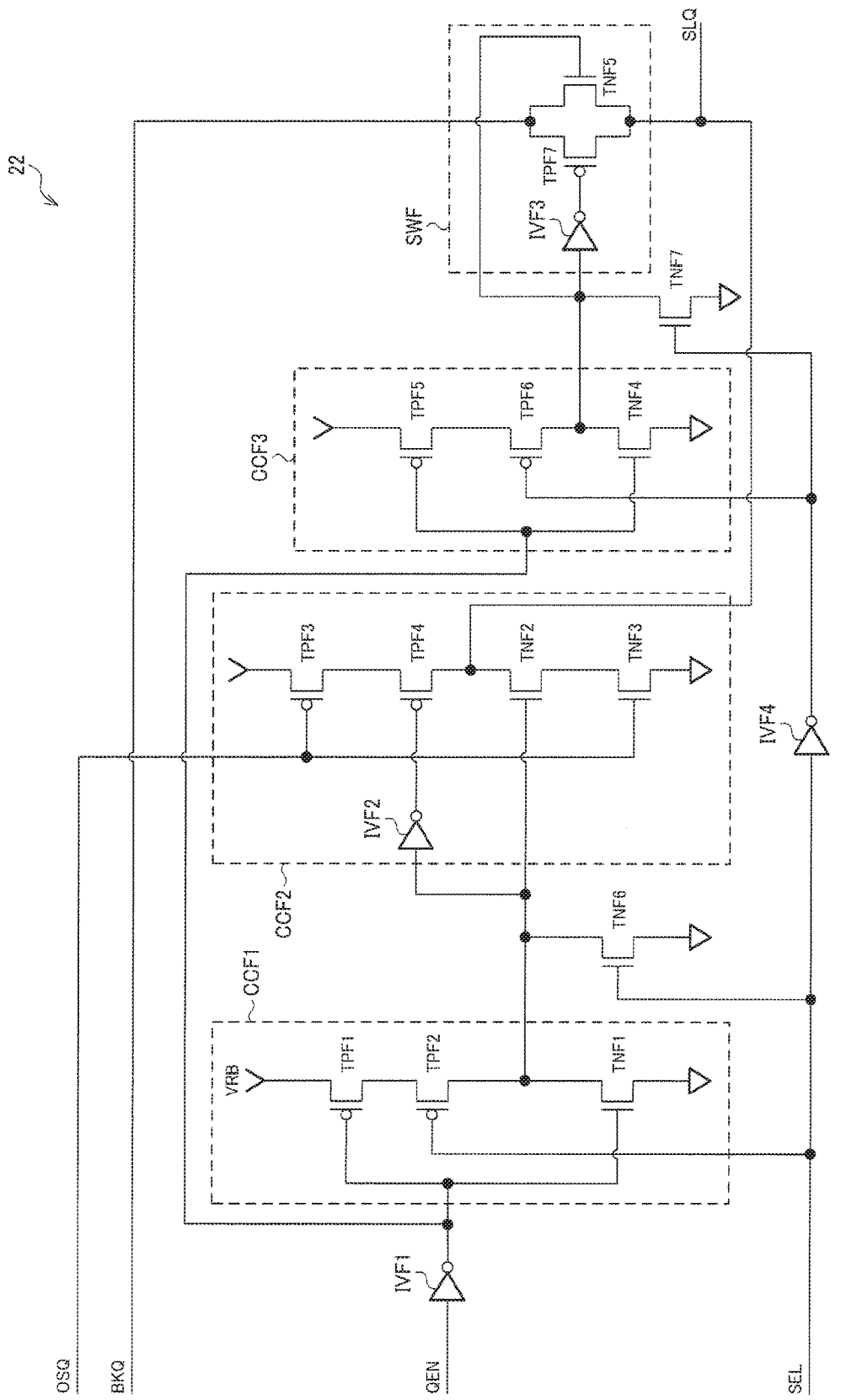
FIG. 12 illustrates a detailed configuration example of a selection circuit.

FIG. 12 illustrates a detailed configuration example of the selection circuit 22. The selection circuit 22 includes inverters IVF1 to IVF3, transistors TPF1 to TPF7 (a P type transistor or a first conductivity type transistor), and transistors TNF1 to TNF7 (an N type transistor or a second conductivity type transistor).

Here, a circuit formed of the transistors TPF1, TPF2 and TNF1 will be referred to as a circuit CCF1. A circuit formed of the inverter IVF2, and transistors TPF3, TPF4, TNF2 and TNF3 will be referred to as a circuit CCF2. A circuit formed of the transistors TPF5, TPF6 and TNF4 will be referred to as a circuit CCF3. A circuit formed of the inverter IVF3, and the transistors TPF7 and TNF5 will be referred to as a switch circuit SWF.

In a case where the output enable signal QEN has a low level (inactive), the transistor TNF1 of the circuit CCF1 is turned on, and thus an output from the circuit CCF1 has a low level. Thus, the transistors TPF4 and TNF2 of the circuit CCF2 are turned off, and an output from the circuit CCF2 is brought into a high impedance state. The transistor TNF4 of the circuit CCF3 is turned on, and thus an output from the circuit CCF3 has a low level. Therefore, the transistors TPF7 and TNF5 of the switch circuit SWF are turned off. Through the operation, an output from the selection circuit 22 is brought into a high impedance state.

In a case where the output enable signal QEN has a high level (active), an operation differs depending on the selection signal SEL. In other words, in a case where the selection signal SEL has a low level, the transistors TPF1 and TPF2 of the circuit CCF1 are turned on, and thus an output from the circuit CCF1 has a high level. Thus, the transistors TPF4 and TNF2 of the circuit CCF2 are turned on, and thus the circuit CCF2 buffers the output signal OSQ from the oscillation circuit 10 and outputs a buffered signal. Since the transistor TNF7 provided between an output node of the circuit CCF3 and a low potential side power source is turned on, an output from the circuit CCF3 has a low level, and thus the transistors TPF7 and TNF5 of the switch circuit SWF are turned off. Through the above-described operation, the output signal SLQ from the selection circuit 22 becomes the output signal OSQ from the oscillation circuit 10.

On the other hand, in a case where the output enable signal QEN has a high level, and the selection signal SEL has a low level, the transistor TNF6 provided between an output node of the circuit CCF1 and the low potential side power source is turned on, and thus an output from the circuit CCF1 has a low level. Thus, the transistors TPF4 and TNF2 of the circuit CCF2 are turned off, and an output from the circuit CCF2 is brought into a high impedance state. Since the transistors TPF5 and TPF6 of the circuit CCF3 are turned on, an output from the circuit CCF3 has a high level. Therefore, the transistors TPF7 and TNF5 of the switch circuit SWF are turned on, and thus the switch circuit SWF causes the frequency division signal BKQ to pass therethrough. Through the above-described operation, the output signal SLQ from the selection circuit 22 becomes the frequency division signal BKQ.

8. Oscillation Circuit

Figure 13:
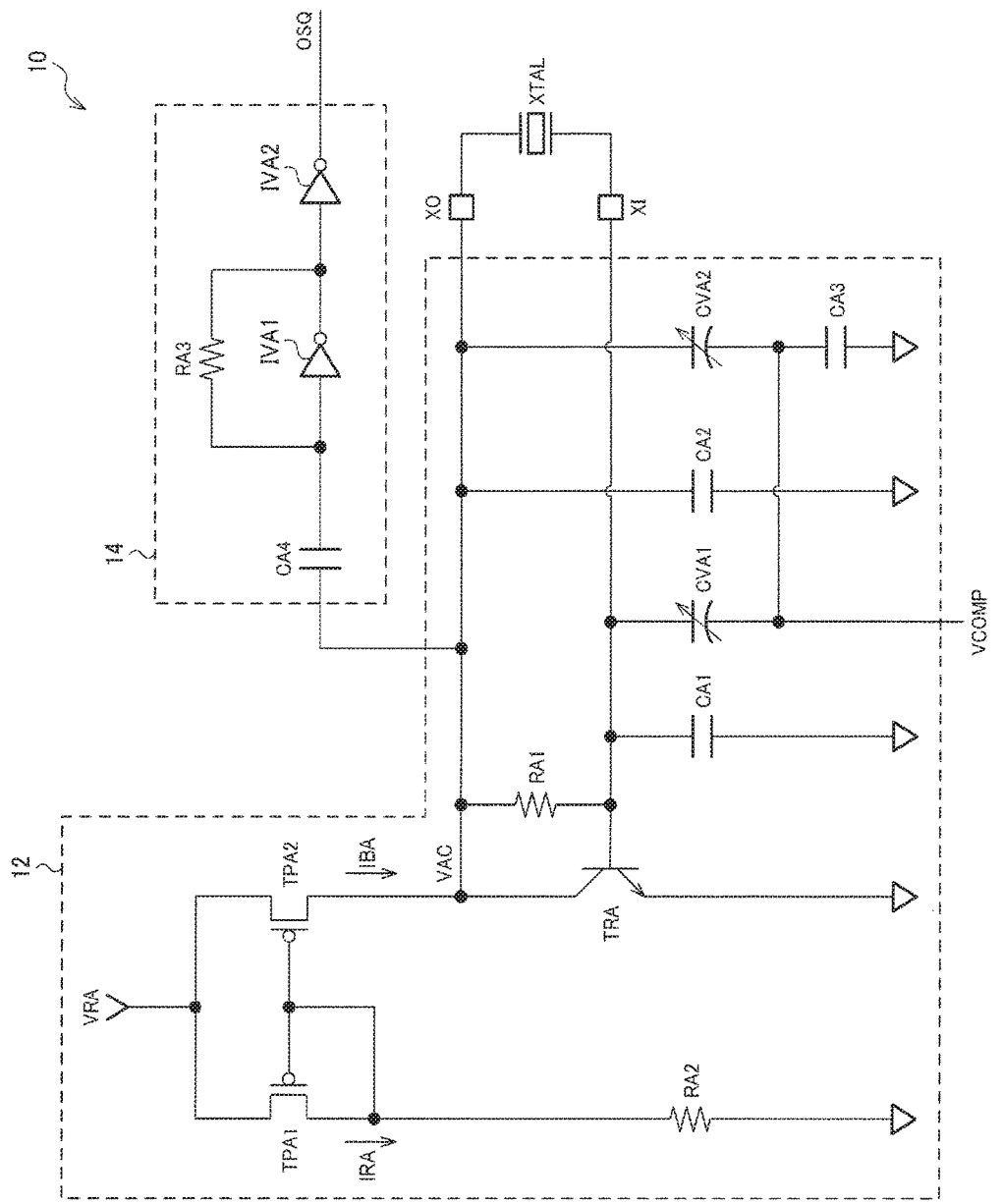
FIG. 13 illustrates a detailed configuration example of an oscillation circuit.

FIG. 13 illustrates a detailed configuration example of the oscillation circuit 10. The oscillation circuit 10 includes an oscillation unit 12 (oscillation circuit main body) and a buffer 14 (amplification unit).

The oscillation unit 12 includes a current mirror circuit (current source) formed of transistors TPA1 and TPA2 (P type transistors or first conductivity type transistors) and a resistive element RA2. The current mirror circuit mirrors a current IRA flowing through the resistive element RA2 so as to output a bias current IBA.

The oscillation unit 12 includes a bipolar transistor TRA, a resistive element RA1, capacitors CA1 to CA3, and varactors CVA1 and CVA2 (variable capacitance diodes or variable capacitance capacitors). A collector terminal of the bipolar transistor TRA is connected to one end of the resonator XTAL via a terminal XO (pad), and a base terminal thereof is connected to the other end of the resonator XTAL via a terminal XI (pad). A base-emitter current generated by oscillation of the resonator XTAL flows through the bipolar transistor TRA. If the base-emitter current increases, a collector-emitter current increases, a bias current into which the bias current IBA branches toward the resistive element RA1 is reduced, and thus a collector voltage VCA is reduced. On the other hand, if the base-emitter current is reduced, the collector-emitter current is reduced, a bias current into which the bias current IBA branches toward a resistive element RX increases, and thus the collector voltage VCA increases. The collector voltage VCA is fed back to the resonator XTAL, and thus the resonator XTAL oscillates.

An oscillation frequency in the resonator XTAL has temperature characteristics, and the temperature characteristics are compensated for by a temperature compensation voltage VCOMP generated by the temperature compensation unit 150. In other words, the temperature compensation voltage VCOMP is input to one ends of the varactors CVA1 and CVA2, and capacitance values of the varactors CVA1 and CVA2 are controlled on the basis of the temperature compensation voltage VCOMP. The other ends of the varactors CVA1 and CVA2 are respectively connected to the base terminal and the collector terminal of the bipolar transistor TRA. If capacitance values of the varactors CVA1 and CVA2 change, a resonance frequency of an oscillation loop changes, and thus a change in the oscillation frequency due to the temperature characteristics of the resonator XTAL is compensated for.

The oscillation circuit of the present embodiment is not limited to the configuration illustrated in FIG. 13, and may employ various oscillation circuits. In FIG. 13, a description has been made of an example of a case where the varactors CVA1 and CVA2 are variable capacitance capacitors, but the present embodiment is not limited thereto, and only one of the varactors CVA1 and CVA2 may be a variable capacitance capacitor which is controlled on the basis of the temperature compensation voltage VCOMP.

The buffer 14 includes a capacitor CA4, a resistive element RA3, and inverters IVA1 and IVA2. The collector voltage VCA (oscillation signal) is input to the inverter IVA1 via the capacitor CA4. An output from the inverter IVA1 is fed back to an input thereof via the resistive element RA3, and thus a bias point of the input of the inverter IVA1 is controlled. The inverter IVA2 buffers the output from the inverter IVA1, and outputs the buffered signal as the output signal OSQ.

9. Detailed Configuration Example of Circuit Device

Figure 14:
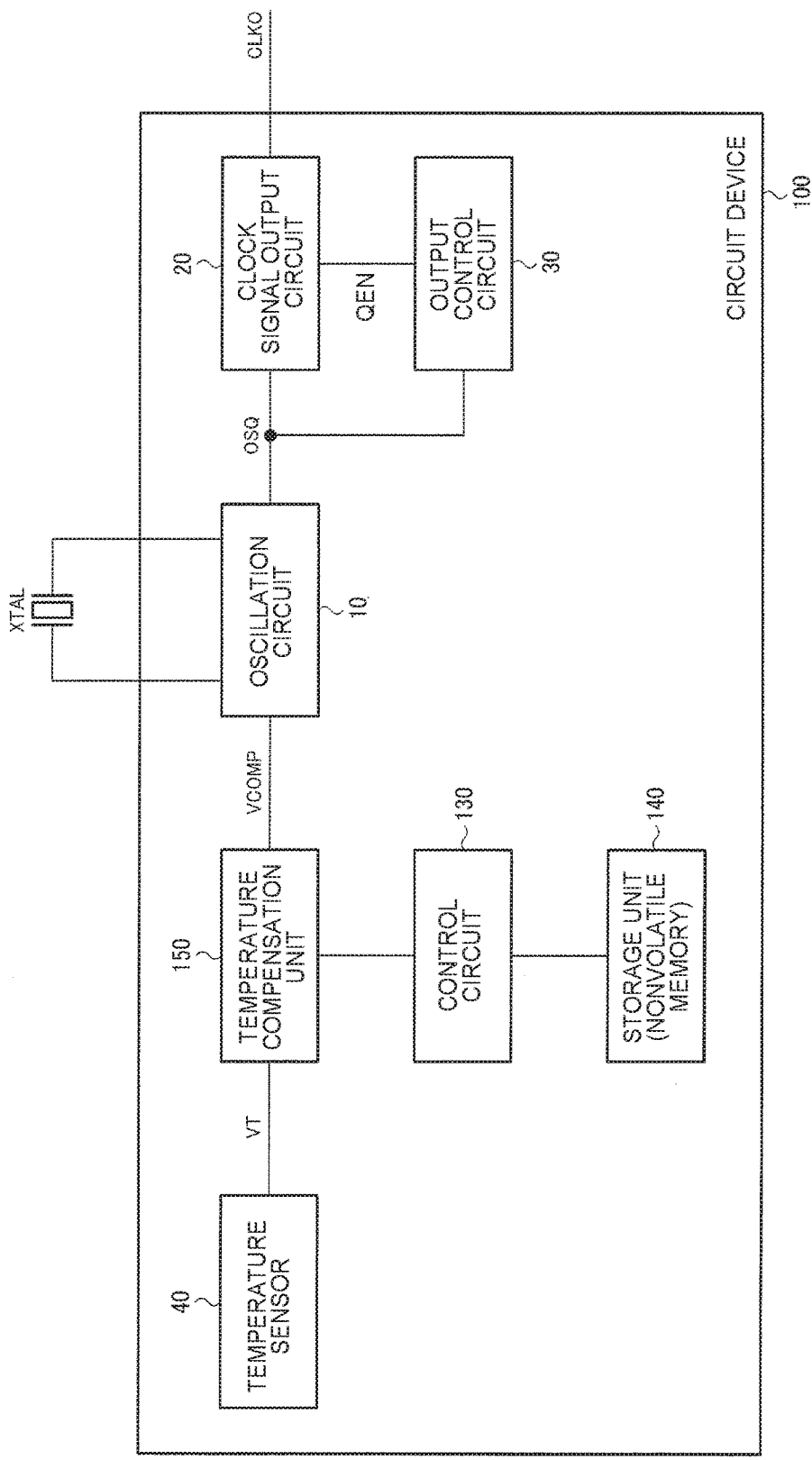
FIG. 14 illustrates a first detailed configuration example of a circuit device of the present embodiment.

FIG. 14 is a first detailed configuration example of the circuit device 100 of the present embodiment. Hereinafter, as an example, a description will be made of a case where the circuit device 100 is applied to a TCXO (or an OCXO), but the present embodiment is not limited thereto, and the above-described method of the present embodiment is also applicable to a case where temperature compensation is not performed.

The circuit device 100 includes a temperature sensor 40, a temperature compensation unit 150 (temperature compensation circuit), a control circuit 130, a storage unit 140 (nonvolatile memory), an oscillation circuit 10, a clock signal output circuit 20, and an output control circuit 30. A configuration of the circuit device is not limited to the configuration illustrated in FIG. 14, and may be variously modified, for example, some of the constituent elements may be omitted (for example, the temperature sensor 40 or the temperature compensation unit 150), or other constituent elements may be added thereto.

The control circuit 130 controls each unit of the circuit device 100. The control circuit 130 performs an interface process with an external device (for example, a CPU) of the circuit device 100. The control circuit 130 is implemented by a logic circuit such as a gate array.

The storage unit 140 stores various pieces of information required for an operation of the circuit device 100. For example, information (coefficients of a polynomial for temperature compensation) required for the temperature compensation unit 150 to perform a temperature compensation process is stored. This information is written from an external device (for example, a test device), for example, during manufacturing of the circuit device 100 or manufacturing of an oscillator in which the circuit device 100 and the resonator XTAL are packaged.

The temperature compensation unit 150 generates the temperature compensation voltage VCOMP for realizing temperature compensation of an oscillation frequency in the oscillation circuit 10 on the basis of the temperature detection signal VT (temperature detection voltage) from the temperature sensor 40, and outputs the temperature compensation voltage VCOMP to the oscillation circuit 10. For example, temperature characteristics of an oscillation frequency of the resonator XTAL are measured with a test device, and a third-order or fifth-order polynomial (approximate expression) for canceling (reducing a change in an oscillation frequency due to the temperature characteristics) the temperature characteristics is obtained. Coefficients of the polynomial are written in the storage unit 140. When the temperature compensation unit 150 performs temperature compensation, the control circuit 130 reads the coefficients of the polynomial from the storage unit 140, and outputs the coefficients to the temperature compensation unit 150. The temperature compensation unit 150 generates the temperature compensation voltage VCOMP for canceling (reducing a change in an oscillation frequency due to the temperature characteristics) temperature characteristics of an oscillation frequency on the basis of the coefficients. For example, in a case of a third-order polynomial, the temperature compensation unit 150 includes a first-order component generation circuit generating a first-order component, a third-order component generation circuit generating a third-order component, a first-order component amplification circuit amplifying an output from the first-order component generation circuit, a third-order component amplification circuit amplifying an output from the third-order component generation circuit, and an addition circuit which adds outputs from the first-order and third-order component amplification circuits together so as to output the temperature compensation voltage VCOMP.

The temperature sensor 40 is a sensor which detects a temperature of the circuit device 100 (semiconductor chip). For example, the temperature sensor 40 may be formed of a diode (PN junction) or the like. In this case, a temperature is detected by using temperature dependency of a forward voltage of the diode. In other words, the temperature detection signal VT is output on the basis of the forward voltage of the diode. The temperature sensor 40 is not limited thereto, and may employ various temperature sensors such as a thermistor. The invention also includes a configuration in which a temperature is detected on the basis of a difference between oscillation frequencies by using two oscillation circuits having different frequency-temperature characteristics. In this case, the oscillation circuits may be oscillation circuits using resonators, and may be ring oscillators or RC oscillation circuits. The oscillation circuit 10 for generating an oscillation signal may be used as one of the oscillation circuits.

Figure 15:
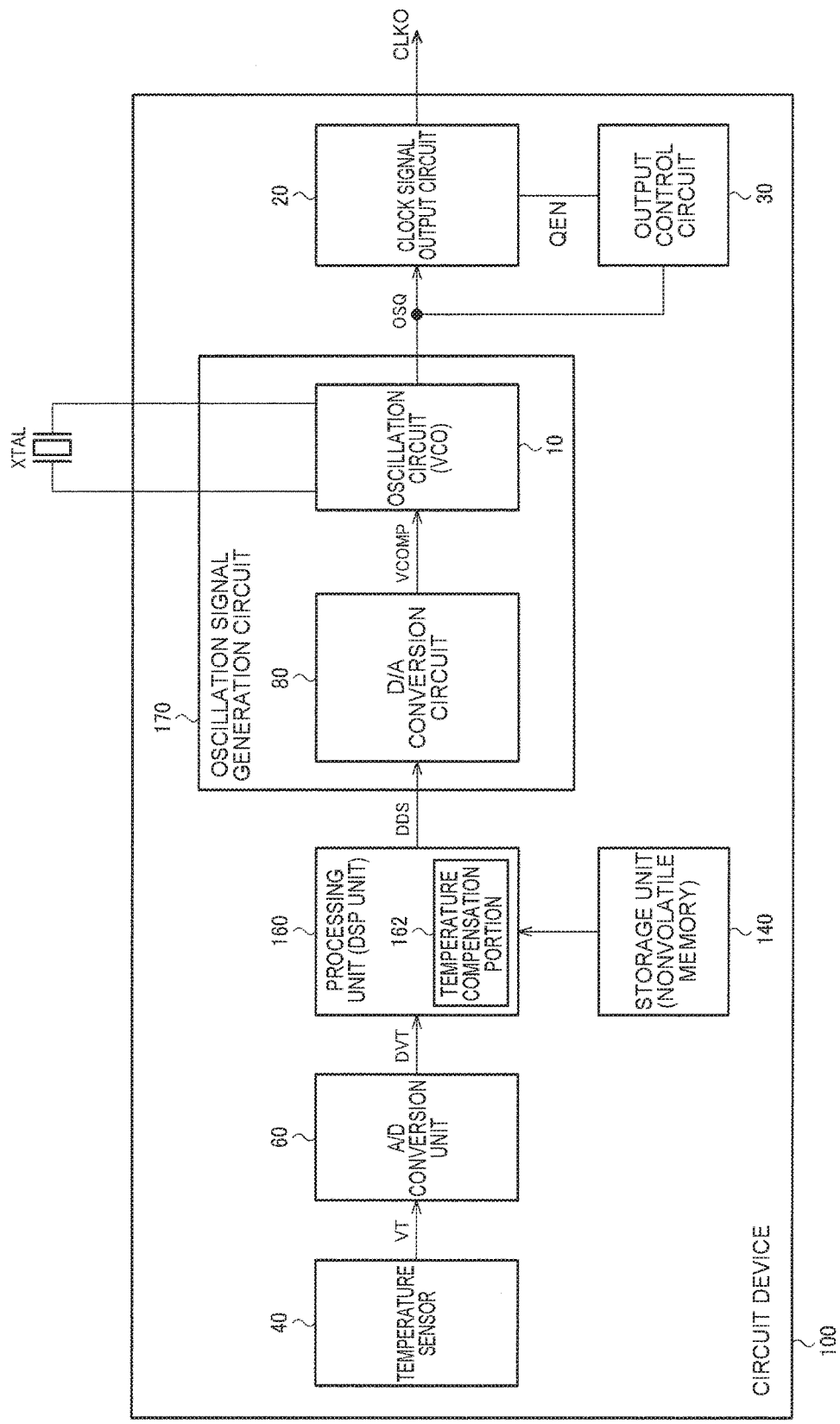
FIG. 15 illustrates a second detailed configuration example of the circuit device of the present embodiment.

FIG. 15 is a second detailed configuration example of the circuit device 100 of the present embodiment. FIG. 15 illustrates a configuration example of a so-called digital TCXO (or a digital OCXO) performing temperature compensation through digital signal processing. The circuit device 100 in FIG. 15 includes a temperature sensor 40, an A/D conversion unit 60 (A/D conversion circuit), a processing unit 160 (a DSP unit or a processing circuit), a storage unit 140 (nonvolatile memory), an oscillation signal generation circuit 170, a clock signal output circuit 20, and an output control circuit 30. A configuration of the circuit device is not limited to the configuration illustrated in FIG. 15, and may be variously modified, for example, some of the constituent elements may be omitted, or other constituent elements may be added thereto.

The A/D conversion unit 60 performs A/D conversion on the temperature detection signal VT, and outputs digital data obtained through the A/D conversion as the temperature detection data DVT. As an A/D conversion method, for example, a successive comparison method, a double integration method, a flash method, or a pipeline method may be used.

The processing unit 160 performs various digital signal processing so as to generate frequency control data DDS, and outputs the frequency control data DDS to the oscillation signal generation circuit 170. For example, the processing unit 160 includes a temperature compensation portion 162. The temperature compensation portion 162 performs a temperature compensation process on the basis of the temperature detection data DVT so as to generate the frequency control data DDS for canceling (reducing a change in an oscillation frequency due to the temperature characteristics) temperature characteristics of an oscillation frequency of the resonator XTAL. In the temperature compensation process, the frequency control data DDS is calculated on the basis of a third-order or fifth-order polynomial for canceling (reducing a change in an oscillation frequency due to the temperature characteristics) the temperature characteristics of the oscillation frequency. Coefficients of the polynomial are written in the storage unit 140 during manufacturing or the like in the same manner as in FIG. 14.

The oscillation signal generation circuit 170 generates an oscillation signal (output signal OSQ) by using the resonator XTAL and the frequency control data DDS. Specifically, an oscillation signal (output signal OSQ) of an oscillation frequency corresponding to the frequency control data DDS is generated by using the resonator XTAL. For example, the oscillation signal generation circuit 170 includes a D/A conversion circuit 80 and an oscillation circuit 10 (VCO). THE D/A conversion circuit 80 performs D/A conversion on the frequency control data DDS, and outputs a voltage obtained through the D/A conversion to the oscillation circuit 10 as the temperature compensation voltage VCOMP. The oscillation circuit 10 causes the resonator XTAL to oscillate at an oscillation frequency corresponding to the temperature compensation voltage VCOMP.

10. Oscillator, Electronic Apparatus, and Vehicle

Figure 16:
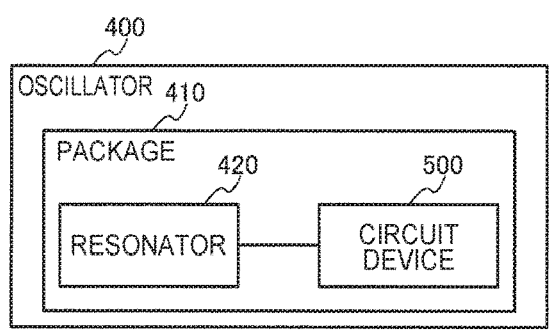
FIG. 16 illustrates a configuration example of an oscillator.

FIG. 16 illustrates a configuration example of an oscillator 400 provided with the circuit device of the present embodiment. As illustrated in FIG. 16, the oscillator 400 includes an resonator 420 (resonator) and a circuit device 500. The resonator 420 and the circuit device 500 are mounted in a package 410 of the oscillator 400. A terminal of the resonator 420 is electrically connected to a terminal (pad) of the circuit device 500 (IC) via an internal wiring of the package 410.

Figure 17:
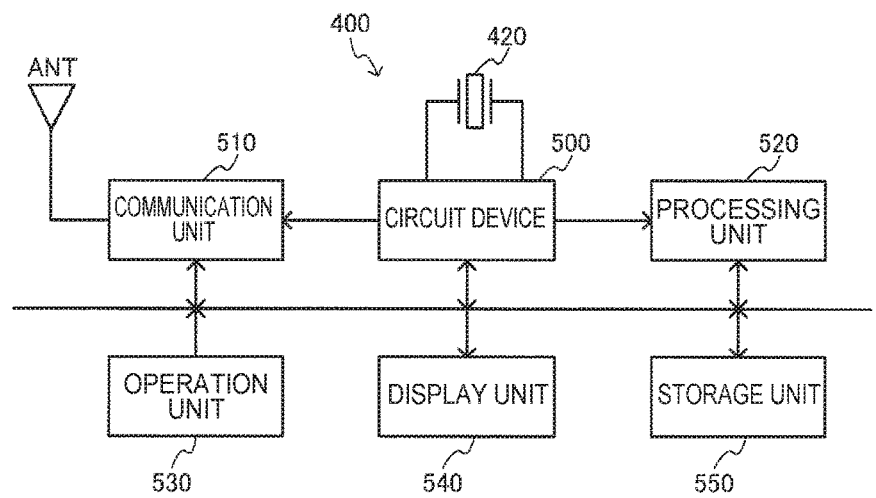
FIG. 17 illustrates a configuration example of an electronic apparatus.

FIG. 17 illustrates a configuration example of an electronic apparatus including the circuit device of the present embodiment. The electronic apparatus includes the circuit device 500, the resonator 420 such as a quartz crystal resonator, an antenna ANT, a communication unit 510 (communication device), and a processing unit 520 (processing device). The electronic apparatus may include an operation unit 530 (operation device), a display unit 540 (display device), and a storage unit 550 (memory). The oscillator 400 is formed of the resonator 420 and the circuit device 500. A configuration of the electronic apparatus is not limited to the configuration illustrated in FIG. 17, and may be variously modified by omitting some constituent elements or adding other constituent elements thereto.

As the electronic apparatus in FIG. 17, there may be various apparatuses, for example, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, a video apparatus such as a digital camera or a video camera, and a network related apparatus such as a base station or a router.

The communication unit 510 (wireless circuit) performs a process of receiving data from an external apparatus or transmitting data to the external apparatus, via the antenna ANT. The processing unit 520 performs a process of controlling the electronic apparatus, or various digital processes on data which is transmitted and received via the communication unit 510. The function of the processing unit 520 may be realized by, for example, a processor such as a microcomputer. The operation unit 530 is used for a user to perform an input operation, and may be implemented by, for example, an operation button or a touch panel display. The display unit 540 displays various pieces of information, and may be implemented by, for example, a liquid crystal display or an organic EL display. In a case where a touch panel display is used as the operation unit 530, the touch panel display also functions as the operation unit 530 and the display unit 540. The storage unit 550 stores data, and a function thereof may be realized by a semiconductor memory such as a RAM or a ROM, or a hard disk drive (HDD).

Figure 18:
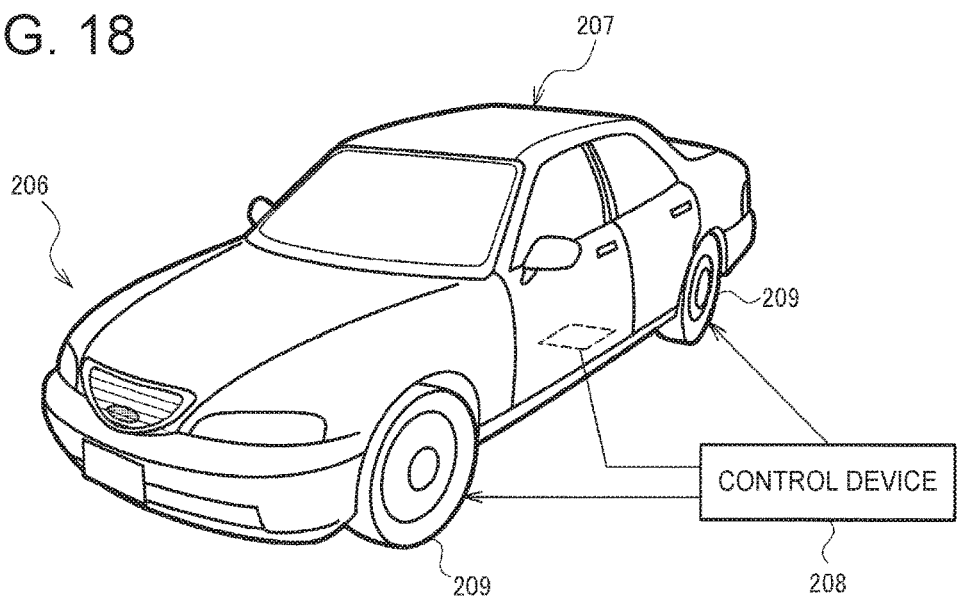
FIG. 18 illustrates a configuration example of a vehicle.

FIG. 18 illustrates an example of a vehicle including the circuit device of the present embodiment. The circuit device (the oscillator) of the present embodiment may be incorporated into, for example, various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 18 schematically illustrates an automobile 206 as a specific example of the vehicle. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a vehicle such as the automobile 206.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies which are mentioned at least once along with different terminologies which have broader meanings or the same meanings may be replaced with the different terminologies in any location of the specification or the drawings. All combinations of the present embodiment and the modification examples are included in the scope of the invention. In addition, configurations, operations, and the like of the circuit device, the oscillator, the electronic apparatus, and the vehicle are also not limited to the above description of the present embodiment, and may have various modifications.

The entire disclosure of Japanese Patent Application No. 2016-201488, filed Oct. 13, 2016 is expressly incorporated by reference herein.

What is claimed is:

1. A circuit device comprising:
   an oscillation circuit that causes a resonator to oscillate;
   a clock signal output circuit that outputs a clock signal based on an output signal from the oscillation circuit; and
   an output control circuit that controls output from the clock signal output circuit,
   wherein the output control circuit includes:
      a counter circuit that performs a counting process based on the output signal from the oscillation circuit, and
      a count enable signal generation circuit that outputs a count enable signal for the counter circuit, and
   wherein the counter circuit starts the counting process when the count enable signal becomes active, and outputs an output enable signal for the clock signal to the clock signal output circuit based on a result of the counting process, and
   wherein the count enable signal generation circuit monitors an amplitude of the output signal from the oscillation circuit and enables the counter circuit when the amplitude exceeds a predetermined voltage, and
   wherein the counter circuit outputs an output enable signal a predetermined period subsequent to the amplitude exceeding the predetermined voltage.

2. The circuit device according to claim 1,
   wherein the count enable signal generation circuit generates the count enable signal based on the output signal from the oscillation circuit.

3. The circuit device according to claim 1,
   wherein the count enable signal generation circuit includes a smoothing circuit that smooths the output signal from the oscillation circuit.

4. The circuit device according to claim 3,
   wherein the count enable signal generation circuit further includes a detection circuit that detects a voltage level of an output signal from the smoothing circuit, and outputs the count enable signal.

5. The circuit device according to claim 4,
   wherein the detection circuit causes the count enable signal to be active when a voltage level of the output signal from the smoothing circuit exceeds a predetermined voltage level.

6. The circuit device according to claim 4,
   wherein the detection circuit includes:
      a logic inversion circuit to which the output signal from the smoothing circuit is input; and
      a Schmitt trigger circuit that receives an output signal from the logic inversion circuit and outputs the count enable signal.

7. The circuit device according to claim 4,
   wherein the detection circuit causes the count enable signal to be inactive when the output enable signal becomes active.

8. The circuit device according to claim 1,
   wherein the counter circuit starts the counting process when the count enable signal becomes active, and causes the output enable signal to be active when a count value in the counting process reaches a predetermined set value.

9. The circuit device according to claim 8,
   wherein the predetermined set value is variable.

10. The circuit device according to claim 9, further comprising:
    a temperature compensation circuit that performs temperature compensation on an oscillation frequency in the oscillation circuit based on a temperature detection signal from a temperature sensor,
    wherein the predetermined set value is set to be variable based on the temperature detection signal.

11. The circuit device according to claim 1,
    wherein the counter circuit includes:
       a counter that performs a counting operation based on the output signal from the oscillation circuit; and
       an output circuit that causes the output enable signal to be inactive when a reset signal is active, and causes the output enable signal to be active when an output signal from the counter becomes active after the reset signal becomes inactive.

12. The circuit device according to claim 11,
    wherein the output circuit is an RS latch.

13. The circuit device according to claim 1,
    wherein the clock signal output circuit includes:
       a selection circuit that selects either one of the output signal from the oscillation circuit and a frequency division signal obtained by dividing a frequency of the output signal from the oscillation circuit; and
       a switch circuit,
    wherein, when the output enable signal is inactive, the selection circuit is in a high impedance output state, and the switch circuit sets an output from the selection circuit to a predetermined voltage level, and
    wherein, when the output enable signal is active, the selection circuit selects and outputs either one of the output signal from the oscillation circuit and the frequency division signal.

14. An oscillator comprising:
    the circuit device according to claim 1; and
    the resonator.

15. An oscillator comprising:
    the circuit device according to claim 2; and
    the resonator.

16. An oscillator comprising:
    the circuit device according to claim 3; and
    the resonator.

17. An electronic apparatus comprising the circuit device according to claim 1.

18. An electronic apparatus comprising the circuit device according to claim 2.

19. A vehicle comprising the circuit device according to claim 1.

20. A vehicle comprising the circuit device according to claim 2.

* * * * *